US006645830B2

(12) United States Patent
Shimoda et al.

(10) Patent No.: US 6,645,830 B2
(45) Date of Patent: Nov. 11, 2003

(54) EXFOLIATING METHOD, TRANSFERRING METHOD OF THIN FILM DEVICE, AND THIN FILM DEVICE, THIN FILM INTEGRATED CIRCUIT DEVICE AND LIQUID CRYSTAL DISPLAY DEVICE PRODUCED BY THE SAME

(75) Inventors: Tatsuya Shimoda, Suwa (JP); Satoshi Inoue, Suwa (JP); Wakao Miyazawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/091,562

(22) Filed: Mar. 7, 2002

(65) Prior Publication Data

US 2002/0146893 A1 Oct. 10, 2002

Related U.S. Application Data

(63) Continuation of application No. 09/051,966, filed as application No. PCT/JP97/02972 on Aug. 26, 1997, now Pat. No. 6,372,608.

(30) Foreign Application Priority Data

| Aug. 27, 1996 | (JP) | 8-225643 |
| Nov. 12, 1996 | (JP) | 8-300371 |
| Nov. 12, 1996 | (JP) | 8-300373 |
| Nov. 12, 1996 | (JP) | 8-315590 |
| Jul. 3, 1997 | (JP) | 9-193081 |
| Jul. 3, 1997 | (JP) | 9-193082 |

(51) Int. Cl.$^7$ .................................................. H01L 21/46
(52) U.S. Cl. ................... 438/455; 438/456; 438/458; 438/464
(58) Field of Search .......................... 438/455, 456, 438/458, 464

(56) References Cited

U.S. PATENT DOCUMENTS

| 5,073,230 A | 12/1991 | Maracas et al. ............. 438/453 |
| 5,206,749 A | 4/1993 | Zavracky et al. ............. 349/45 |
| 5,559,043 A | 9/1996 | Bruel .......................... 438/407 |
| 5,821,138 A | 10/1998 | Yamazaki .................... 438/166 |
| 6,127,199 A | 10/2000 | Inoue et al. .................. 438/30 |
| 6,143,582 A | 11/2000 | Vu et al. ....................... 438/30 |

FOREIGN PATENT DOCUMENTS

| EP | 0 658 929 A1 | 12/1994 |
| EP | 0 665 588 A1 | 1/1995 |
| JP | 6-291291 | 10/1994 |
| JP | 8-288522 | 11/1996 |

OTHER PUBLICATIONS

Sameshima, T. "Laser Beam Application to Thin Film Transistors," *Applied Surface Science* 96–98, (1996), pp. 352–358.

Brannon, Excimer Lasers Continue to Revolutionize the Processing of Microelectronic Materials, (IEEE), pp. 19–24 (1990).

Brannon, Excimer laser Ablation and Etching, (IEEE), pp. 11–18 (Mar. 1997__.

Sumiiyoshi et al., Device Layer Transferred Poly–Si TFT Array for High Resolution LC Projector, (IEEE) pp. 165–168 (1989).

*Primary Examiner*—Olik Chaudhuri
*Assistant Examiner*—William M. Brewster
(74) *Attorney, Agent, or Firm*—Oliff & Berridge, PLC

(57) ABSTRACT

A method for transferring a thin film device on a substrate onto a transfer member, includes a step for forming a separation layer on the substrate, a step for forming a transferred layer including the thin film device on the separation layer, a step for adhering the transferred layer including the thin film device to the transfer member with an adhesive layer therebetween, a step for irradiating the separation layer with light so as to form internal and/or interfacial exfoliation of the separation layer, and a step for detaching the substrate from the separation layer.

15 Claims, 25 Drawing Sheets

LASER LIGHT

LASER LIGHT (A)

(C)

(B)

(D)

(E)

US 6,645,830 B2

EXFOLIATING METHOD, TRANSFERRING METHOD OF THIN FILM DEVICE, AND THIN FILM DEVICE, THIN FILM INTEGRATED CIRCUIT DEVICE AND LIQUID CRYSTAL DISPLAY DEVICE PRODUCED BY THE SAME

This is a Continuation of application Ser. No. 09/051,966 filed Apr. 24, 1998, which is a 371 of PCT/JP97/02972, filed Aug. 26, 1997.

BACKGROUND OF THE INVENTION

1. Field of Invention

The present invention relates to a method for exfoliating a detached member, and in particular, a transferring method for exfoliating a transferred layer comprising a thin film such as functional thin film and for transferring it onto a transfer member such as a transparent substrate. Also, the present invention relates to a transferring method of a thin film device, a thin film device, a thin film integrated circuit device, and a liquid crystal display device produced using the same.

2. Description of Related Art

Production of liquid crystal displays using thin film transistors (TFTs), for example, includes a step for forming thin film transistors on a transparent substrate by a CVD process or the like.

The thin film transistors are classified into those using amorphous silicon (a-Si) and those using polycrystalline silicon (p-Si), and those using polycrystalline silicon are classified into those formed by a high temperature process and those formed by a low temperature process.

Since the formation of such thin film transistors on a substrate involves treatment at a relatively high temperature, a heat resistant material, that is, a material having a high softening point and a high melting point must be used as the transparent substrate. At present, in the production of TFTs by high temperature processes, transparent substrates composed of quartz glass which are sufficiently resistive to a temperature of approximately 1,000° C. are used. When TFTs are produced by low temperature processes, the maximum process temperature is near 500° C., hence heat-resisting glass which is resistive to a temperature near 500° C. is used.

As described above, a substrate for use in forming thin film devices must satisfy the conditions for producing these thin film devices. The above-mentioned "substrate" is, however, not always preferable in view of only the steps after fabrication of the substrate provided with thin film devices is completed.

For example, in the production process with high temperature treatment, quartz glass or heat-resisting glass is used, however, they are rare and very expensive materials, and a large transparent substrate can barely be produced from the material.

Further, quartz glass and heat-resisting glass are fragile, easily broken, and heavy. These are severe disadvantages when a substrate provided with thin film devices such as TFTs is mounted into electronic units. There is a gap between restriction due to process conditions and preferred characteristics required for products, hence it is significantly difficult to satisfy both the restriction and characteristics.

SUMMARY OF THE INVENTION

The present invention has been achieved in view of such a problem, and has an object to provide an exfoliating method, which permits easy exfoliation regardless of characteristics of the detached member and conditions for exfoliating, and transferring to various transfer members. Another object is to provide a novel technology which is capable of independently selecting a substrate used in production of thin film devices and a substrate used when the product is used (a substrate having preferable properties for use of the product). A further object is to provide a novel technology not causing deterioration of characteristics of thin film devices which are transferred onto a substrate, by decreasing the optical energy radiated to the separable layer causing ablation in the transferring process.

DISCLOSURE OF INVENTION

1. First, method for exfoliating a detached member or a transferred layer form a substrate for production is disclosed. The inventions are as follows: (1) An exfoliating method in accordance with the present invention is a method for exfoliating a detached member, which is present on a substrate with a separation layer therebetween, from the substrate, wherein the separation layer is irradiated with incident light so as to cause exfoliation in the separation layer and/or at the interface, and to detach the detached member from the substrate.

(2) A method for exfoliating a detached member, which is present on a transparent substrate with a separation layer therebetween, from the substrate, wherein the separation layer is irradiated with incident light from the side of the substrate so as to cause exfoliation in the separation layer and/or at the interface, and to detach the detached member from the substrate.

(3) A method for exfoliating a transferred layer formed on a substrate with a separation layer therebetween from the substrate and transferring the transferred layer onto a transfer member, wherein after the transfer member is adhered to the opposite side of the transferred layer to the substrate, the separation layer is irradiated with incident light so as to cause exfoliation in the separation layer and/or at the interface, and to detach the transferred layer from the substrate to transfer onto the transfer member.

(4) A method for exfoliating a transferred layer formed on a transparent substrate with a separation layer therebetween from the substrate and transferring the transferred layer onto a transfer member, wherein after the transfer member is adhered to the opposite side of the transferred layer to the substrate, the separation layer is irradiated with incident light from the side of the substrate so as to cause exfoliation in the separation layer and/or at the interface, and to detach the transferred layer from the substrate to transfer onto the transfer member.

(5) An exfoliating method includes a step for forming a separation layer on a transparent substrate, a step for forming a transferred layer on the separation layer directly or with a given interlayer therebetween, a step for adhering the transfer member to the opposite side of the transferred layer to the substrate, and a step for irradiating the separation layer with incident light from the side of the substrate so as to cause exfoliation in the separation layer and/or at the interface, and to detach the transferred layer from the substrate to transfer onto the transfer member.

In connection with these inventions, the following inventions are disclosed.

After transferring the transferred layer onto the transfer member, a step for removing the separation layer adhering to the side of the substrate and/or transfer member may be provided.

A functional thin film or a thin film device may be used as the transferred layer. Particularly, a thin film transistor is preferably used as the transferred layer. Preferably, the transfer member is a transparent substrate.

When the maximum temperature in the formation of the transferred layer is Tmax, it is preferred that the transfer member be composed of a material having a glass transition point (Tg) or softening point which is lower than Tmax. Particularly, it is preferred that the transfer member be composed of a material having a glass transition point (Tg) or softening point which is lower than 800° C.

It is preferable that the transfer member be composed of a synthetic resin or glass.

It is preferable that the substrate has thermal resistance. In particular, when the maximum temperature in the formation of the transferred layer is Tmax, it is preferred that the substrate be composed of a material having a distortion point which is lower than Tmax.

In the above-mentioned exfoliating methods, the exfoliation of the separation layer is caused by an elimination of or a decrease in the adhering force between atoms or molecules in the constituent substances in the separation layer.

It is preferable that the incident light be laser light. Preferably, the laser light has a wavelength of 100 nm to 350 nm. Alternatively, the laser light has a wavelength of 350 nm to 1,200 nm.

It is preferable that the separation layer is composed of amorphous silicon. Preferably, the amorphous silicon contains 2 atomic percent or more of hydrogen (H).

The separation layer may be composed of a ceramic. Alternatively, the separation layer may be composed of a metal. Alternatively, the separation layer may be composed of an organic polymer. In this case, it is preferable that the organic polymer has at least one adhere selected from the group consisting of —$CH_2$—, —CO—, —CONH—, —NH—, —COO—, —N=N—, and —CH=N—. Further, it is preferable that the organic polymer has an aromatic hydrocarbon group in the chemical formula.

2. Next, inventions in which the above-mentioned separation layer includes a plurality of composites are disclosed. These inventions are as follows.

First, the separation layer in the inventions disclosed in paragraph 1 includes a composite with a plurality of layers. Further, the separation layer includes at least two layers having different compositions or characteristics.

It is preferable that the separation layer includes an optical absorption layer for absorbing the incident light and another layer having a different composition or property from the optical absorption layer. Preferably, the separation layer includes the optical absorption layer for absorbing the incident light and a shading layer for shading the incident light. Preferably, the shading layer lies at the opposite side of the optical absorption layer to the incident light. Preferably, the shading layer is a reflection layer for reflecting the incident light. Preferably, the reflection layer is composed of a metallic thin film.

3. A method for transferring a thin film device, which is used as a detached member or a transferred member, will now be disclosed.

A method for transferring a thin film device on a substrate onto a transferred member includes: a step for forming a separation layer on the substrate; a step for forming a transferred layer including the thin film device onto the separation layer; a step for adhering the transferred layer including the thin film device to the transfer member with an adhesive layer, a step for irradiating the separation layer with light so as to cause exfoliation in the separation layer and/or at the interface; and a step for detaching the substrate from the separation layer.

In accordance with the present invention, for example, a separation layer having optical absorption characteristics is provided on a substrate having high reliability in device production, and thin film devices such as TFTs and the like are formed on the substrate. Next, although not for limitation, the thin film devices are adhered to a given transfer member, for example, with an adhesive layer, so as to cause an exfoliation phenomenon in the separation layer, which results in a decrease in adhering between the separation layer and the substrate. The substrate is detached from the thin film devices by the force applied to the substrate. A given device with high reliability can be thereby transferred or formed-onto any transfer members.

In the present invention, either the step for adhering the thin film devices (the transferred layer including the thin film devices) to the transfer member with the adhesive layer or the step for detaching the substrate from the thin film devices may precede. When handling of the thin film devices (the transferred layer including the thin film devices) after detaching the substrate is troublesome, however, it is preferable that the thin film devices be adhered to the transfer member, and then the substrate be detached.

When an adhesive layer for adhering the thin film devices to the transfer member is, for example, a substance having planation, the uneven face formed on the surface of the transferred layer including the thin film devices is negligible by the planation, the adhering to the transfer member is satisfactorily performed. The substrate may be a transparent substrate, and thus the separation layer is irradiated with the light through the transparent substrate. The use of, for example, a transparent substrate, e.g. a quartz substrate, permits production of thin film devices with high reliability and collective irradiation of the entire separation layer with the light from the rear side of the substrate, resulting in an improvement in the transfer efficiency.

4. Inventions in which parts of the steps, disclosed in the above-mentioned paragraph 3, in the method for transferring the thin film device will now be disclosed. These inventions are as follows:

(1) A method for transferring a transferred layer including a thin film device forming on a substrate onto a transfer member comprising: a first step for forming an amorphous silicon layer on the substrate; a second step for forming the transferred layer including the thin film device on the amorphous silicon layer; a third step for adhering the transferred layer including the thin film device to the transfer member with an adhesive layer; a fourth step for irradiating the amorphous silicon layer with light through the substrate so as to cause exfoliation in the amorphous silicon layer and/or at the interface and to decrease the adhering force between the substrate and the transferred layer; and a fifth step for detaching the substrate from the amorphous silicon layer; wherein the transferred layer formed in the second step includes a thin film transistor, and the thickness of the amorphous silicon layer formed in the first step is smaller than the thickness of the channel layer of the thin film transistor formed in the second step.

In this invention, the amorphous silicon layer is used as the layer formed on the substrate in the first step and causes exfoliation by light irradiation. In the amorphous silicon layer as shown in FIG. 39, optical energy, which is radiated in the amorphous silicon layer and which is required for exfoliation (referred to as ablation in FIG. 39), decreases as the thickness decreases.

The transferred layer formed in the second step includes the thin film transistor as a thin film device, its channel layer is formed of silicon, e.g., polycrystalline silicon or amorphous silicon, and the transferred layer has a thickness of more than 25 nm, for example, approximately 50 nm. In this invention, the thickness of the amorphous silicon as the separation layer (ablation layer) formed in the first step is smaller than that of the channel layer of the thin film transistor in the transferred layer. The energy consumed in the light irradiation step therefore decreases, and the light source can be miniaturized. Further, since optical energy by irradiation is low, the deterioration of the thin film device is suppressed if the light leaked from the amorphous silicon layer is incident on the thin film device.

Now, the thickness of the amorphous silicon layer is set to 25 nm or less. As described above, the optical energy, which is radiated in the amorphous silicon layer and which is required for exfoliation, decreases as the thickness decreases, hence the optical energy is significantly low at this thickness. It is preferable that the thickness of the amorphous silicon layer be in a range from 5 nm to 25 nm, more preferably 15 nm or less, and most preferably 11 nm or less in order to further decrease the optical energy, which is radiated in the amorphous silicon layer and which is required for exfoliation.

In the second step, the amorphous silicon layer is formed by a low pressure chemical vapor deposition (LPCVD) process. The amorphous silicon layer formed by the LPCVD process has a higher adhesion compared with a plasma CVD process, an atmospheric pressure (AP) CVD process, or an ECR process, hence there is not much risk of failures, such as evolution of hydrogen and flaking of the film, during the formation of the transferred layer including the thin film device.

(2) A method for transferring a transferred layer including a thin film device on a substrate onto a transfer member comprising: a step for forming a separation layer onto the substrate; a step for forming a silicon-based optical absorption layer on the separation layer; a step for forming the transferred layer including the thin film device on the silicon-based optical absorption layer; a step for adhering the transferred layer including the thin film device to the transfer member with an adhesive layer; a step for irradiating the separation layer with eight through the substrate so as to cause exfoliation in the separation layer and/or at the interface; and a step for detaching the substrate from the separation layer.

In accordance with this invention, if light leaks from the separation layer, the leaked light is absorbed in the silicon-based optical absorption layer before it is incident on the thin film device. No light is therefore incident on the thin film device, hence the thin film device is prevented from characteristic deterioration due to the incident light. The transferred layer including the thin film device can be formed on the silicon-based optical absorption layer. Metallic contamination will therefore not occur as in the case forming the transferred layer onto a metallic layer reflecting light, and the thin film device can be formed by an established thin film deposition technology.

The separation layer and the optical absorption layer are formed of amorphous silicon, and a step for providing a silicon-based intervening layer between the separation layer and the optical absorption layer. As shown in FIG. 39, the amorphous silicon layer, which absorbs the incident light and separates when the energy of the absorbed light reaches a given value, is used as the separation layer and the silicon-based optical absorption layer. As the intervening layer for separating the two amorphous silicon layers, a silicon compound, for example, silicon oxide, is used.

(3) A method for transferring a transferred layer including a thin film device on a substrate onto a transfer member comprising: a first step for forming a separation layer on the substrate; a second step for forming the transferred layer including the thin film device on the separation layer; a third step for adhering the transferred layer including the thin film device to the transfer member with an adhesive layer; a fourth step for irradiating the separation layer with light through the substrate so as to cause exfoliation in the separation layer and/or at the interface; and a fifth step for detaching the substrate from the separation layer; wherein, in the fourth step, the stress, acting on the upper layers above the separation layer in the exfoliation in the separation layer and/or at the interface, is absorbed by the proof stress of the upper layers above the separation layer to prevent the deformation or breakage of the upper layers above the separation layer.

In the fourth step, the substances in the separation layer are optically or thermally excited by the incident light to cut bonds of atoms or molecules on the surface and in the interior and liberate the molecules and atoms to the exterior. This phenomenon is observed as phase transition, such as melting or evaporation, of the partial or entire substances in the separation layer. A stress acts on the upper layers above the separation layer as the molecules or atoms are released. The stress is, however, absorbed by the proof stress of the upper layers above the separation layer so as to prevent deformation or breakage of the upper layers above the separation layer.

The materials and/or thicknesses of the upper layers above the separation layer may be designed in view of such a proof stress. For example, one or more among the thickness of the adhesive layer, the thickness of the transferred layer, the material, and the thickness of the transfer member is designed in view of the proof stress.

Before performing the fourth step, the method further includes a step for forming a reinforcing layer for ensuring the proof stress at any position among the upper layers above the separation layer. In this invention, if the proof stress is not ensured only by the minimum configuration of the upper layers above the separation layer, consisting of the adhesive layer, the transferred layer, and the transfer member, deformation and breakage of the thin film device is prevented by adding the reinforcing layer.

(4) A method for transferring a transferred layer including a thin film device on a substrate onto a transfer member comprising: a first step for forming a separation layer on the substrate; a second step for forming the transferred layer including the thin film device on the separation layer; a third step for adhering the transferred layer including the thin film device to the transfer member with an adhesive layer; a fourth step for irradiating the separation layer with light through the substrate so as to cause exfoliation in the separation layer and/or at the interface; and a fifth step for detaching the substrate from the separation layer; wherein, the fourth step includes sequential scanning of beams for locally irradiating the separation layer, such that a region irradiated by the N-th beam (wherein N is an integer of 1 or more) does not overlap with other irradiated regions.

In the fourth step, beams, such as spot beams or line beams, for locally irradiating the separation layer are intermittently scanned so that substantially all the surface of the separation layer is irradiated with light. The beam scanning is achieved by relative movement between the substrate provided with the separation layer and the beam source or its optical system, and irradiation may be continued or discontinued during the relative movement. In this invention, the intermittent beam scanning is performed so that the adjacent beam-irradiated regions do not overlap with each other.

If the beam-irradiated regions overlap, the region may be irradiated with an excessive amount of light which will cause exfoliation in the separation layer or at the interface. It is clarified by analysis by the present inventor that an excessive amount of light partially leaks, is incident on the thin film device, and causes the deterioration of electrical characteristics and the like of the thin film device.

In the present invention, the separation layer is irradiated with such an excessive amount of light, hence the original characteristics of the thin film device are maintained after the thin film device is transferred onto the transfer member. A zone between individual beam-irradiated regions may be a low irradiation zone in which light is incident during the relative movement or a non-irradiation zone in which no light is incident during the relative movement. Exfoliation does not occur in the low irradiation zone or non-irradiation zone, the adhesion between the separation layer and the substrate can be remarkably reduced.

In the following two inventions, each beam for preventing or suppressing the characteristic deterioration of the thin film device is determined in different views from the invention in paragraph (4).

In the fourth step of the first invention, beams are sequentially scanned to irradiate locally the separation layer, each beam has a flat peak region having the maximum optical intensity in the center, and a region irradiated by the N-th beam (wherein N is an integer of 1 or more) does not overlap with other irradiated regions.

In the fourth step of the other invention, beams are sequentially scanned to irradiate locally the separation layer, each beam has the maximum optical intensity in the central region, and an effective region irradiated by the N-th beam (wherein N is an integer of 1 or more) having an intensity, which is 90% or more of the maximum intensity, does not overlap with the other effective regions irradiated by other beam scanning.

Since individual beams are scanned so that the flat peaks of individual beams or the effective regions having intensities which are 90% or more of the maximum intensity do not overlap with each other, two beams are continuously scanned in the same region in the separation layer.

The total irradiated beam (sum of the optical intensity× time) in the same region is lower than that when the flat peak region or the effective region having intensities which are 90% or more of the maximum intensity is set at the same position in the two consecutively scanned beams. As a result, the separation layer may separate after the second scanning in some regions, and this case does not correspond to the excessive irradiation. In another case, even if the separation layer separates in the first scanning, the intensity of the light incident on the thin film device in the second scanning is decreased, hence the deterioration of the electric characteristics of the thin film device can be prevented or reduced.

In the thin film device formed on a given substrate by a transfer technology of the thin film device (the thin film structure) in accordance with the present invention, the deterioration of various characteristics can be prevented or reduced by improving the irradiating step for exfoliating the separation layer.

When the thin film device is a thin film transistor (TFT), the improved irradiation step for exfoliating the separation layer can prevent the breakdown of the TFT due to a decreased on-current flow and an increased off-current flow in the channel layer of the TFT damaged by the incident light.

5. Further, the following inventions are disclosed in connection with the above-mentioned inventions.

A step for removing the separation layer adhered to the transfer member is provided for completely removing the unnecessary separation layer.

The transfer member is a transparent substrate. For example, inexpensive substrates such as a soda glass substrate and flexible transparent plastic films may be used as the transfer member. When the maximum temperature of the transfer member during the formation is Tmax, the transfer member is composed of a material having a glass transition point (Tg) or softening point which is lower than Tmax.

Although such inexpensive glass substrates etc. have not been used because they are not resistive to the maximum temperature of the conventional device production processes, they can be used in the present invention without restriction.

The glass transition point (Tg) or softening point of the transfer member is lower than the maximum temperature in the process for forming the thin film device. The upper limit of the glass transition point (Tg) or softening point is defined. The transfer member is composed of a synthetic resin or a glass material. For example, when the thin film device is transferred onto a flexible synthetic resin plate such as a plastic film, excellent characteristics which are not obtainable in a glass substrate with high rigidity can be achieved. When the present invention is applied to a liquid crystal device, a flexible lightweight display device which is resistive to falling can be achieved.

Also, a thin film integrated circuit such as a single-chip microcomputer including TFTs can be formed by transferring the TFTs on a synthetic resin substrate by the above-mentioned transferring method.

An inexpensive substrate such as a soda-glass substrate can also be used as the transfer member. A soda-glass substrate is inexpensive and thus has economical advantages. Since alkaline components are dissolved from the soda-glass substrate during annealing of the TFT production, it has been difficult to apply active matrix liquid crystal display devices. In accordance with the present invention, however, since a completed thin film device is transferred, the above-mentioned problems caused by the annealing will not occur. Accordingly, substrates having problems in the prior art technologies, such as a soda-glass substrate, can be used in the field of active matrix liquid crystal display devices.

The substrate has thermal resistivity: The thin film device can be annealed at a high temperature in the production process, and the resulting thin film device has high reliability and high performance.

The substrate has a transmittance of 10% or more for the 310 nm light: The transparent substrate can supply optical energy sufficient to ablation in the separation layer.

When the maximum temperature in the formation of the transferred layer is Tmax, the substrate is composed of a material having a distortion point of Tmax or more: The thin film device can be treated at a high temperature in the production process, and the resulting thin film device has high reliability and high performance.

The separation layer may be composed of amorphous silicon: The amorphous silicon can absorb light, can be easily produced, and has a highly practical use.

The amorphous silicon contains 2 atomic percent or more of hydrogen (H): When the amorphous silicon containing hydrogen is used, hydrogen is released by light irradiation, and an internal pressure occurs in the separation layer to promote exfoliation in the separation layer. The amorphous silicon may contain 10 atomic percent or more of hydrogen (H). The exfoliation in the separation layer is further accelerated by the increased hydrogen content.

Alternatively, the separation layer may be composed of silicon nitride: When using silicon nitride as a separation layer, nitrogen is released by light irradiation to promote exfoliation in the separation layer.

Alternatively, the separation layer may be composed of a hydrogen-containing alloy: When using a hydrogen-containing alloy, hydrogen is released by light irradiation to promote exfoliation in the separation layer.

Alternatively, the separation layer may be composed of a nitrogen-containing alloy: When using a nitrogen-containing alloy, nitrogen is released by light irradiation to promote exfoliation in the separation layer.

The separation layer may be composed of a multi-layered film: The separation layer is therefore not limited to a single-layered film. The multi-layered film is composed of an amorphous silicon film and a metallic film formed thereon.

The separation layer may be composed of at least one material selected from the group consisting of ceramics, metals, and organic polymers. Usable metals include, for example, hydrogen containing alloys and nitrogen containing alloys. As in amorphous silicon, exfoliation in the separation layer is accelerated by the evolution of gaseous hydrogen or nitrogen by light irradiation.

The light is laser light. Laser light is coherent light and is suitable for causing exfoliation in the separation layer. The laser light has a wavelength of 100 nm to 350 nm. The short-wave, high energy laser light results in effective exfoliation in the separation layer. An example of such a laser is an excimer laser. The excimer laser is a gas laser which is capable of outputting laser light with high energy, and four typical types of laser light can be output (XeF=351 nm, XeCl=308 nm, KrF=248 nm, ArF=193 nm) by combinations of rare gasses (Ar, Kr, and Xe) and halogen gasses ($F_2$ and HCl) as laser media. By excimer laser irradiation, direct scission of molecular adheres and gas evolution will occur in the separation layer provided on the substrate, without thermal effects.

The laser light may have a wavelength of 350 nm to 1,200 nm. For the purpose of imparting exfoliation characteristics to the separation layer by changes, such as gas evolution, vaporization, and sublimation, laser light having a wavelength of 350 nm to 1,200 nm can also be used.

The thin film device may be a thin film transistor (TFT). The TFT may be a CMOS-type TFT.

A high-performance TFT can be transferred (formed) on a given transfer member without restriction. Various electronic circuits can therefore be mounted on the transfer member. Accordingly, by the above-mentioned inventions, a thin film integrated circuit device including the thin film device transferred onto the transfer member is achieved. Also, a liquid crystal display device including an active matrix substrate, which is produced by the transfer of the thin film transistors in the pixel region, is achieved, wherein the pixel region includes a matrix of thin film transistors and pixel electrodes each connected to one end of each thin film transistor.

DESCRIPTION OF PREFERRED EMBODIMENTS IN THE CLAIMS

Embodiments of the exfoliating method in accordance with the present invention will no be described in detail with reference to the attached drawings.

First Embodiment

FIGS. 1 to 8 are cross-sectional views of steps in a first embodiment of an exfoliating method in accordance with the present invention. These steps in the exfoliating method (transferring method) in accordance with the present invention will now be described.

Figure 1:
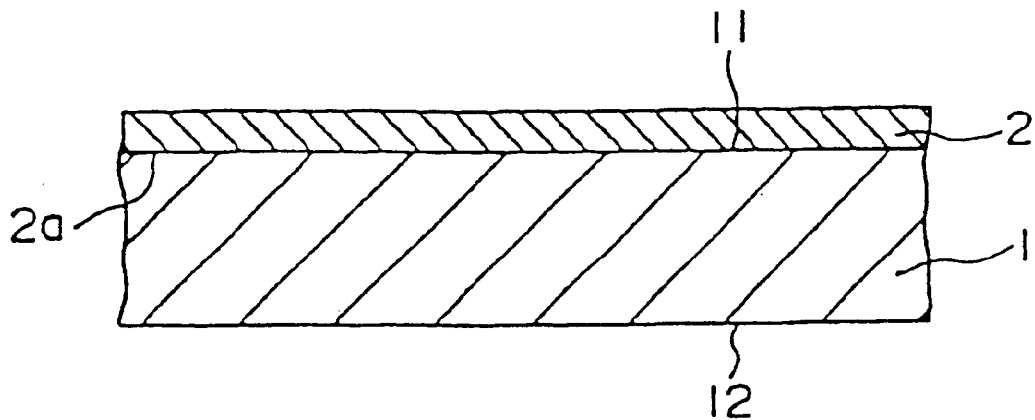
FIGS. 1 to 8 are cross-sectional views of steps in a first embodiment of an exfoliating method in accordance with the present invention.

[1] As shown in FIG. 1, a separation layer (optical absorption layer) 2 is formed on one side (an inner surface 11 forming exfoliation) of a substrate 1. It is preferable that the substrate 1 has transparency to allow indent light 7 to pass through from the side of the substrate 1. The transmittance of the incident light 7 is preferably 10% or more, and more preferably 50% or more. A significantly low transmittance causes a large loss of the incident light 7, hence a larger amount of light is required for exfoliation of the separation layer 2.

The substrate 1 is preferably composed of a material with high reliability, and particularly composed of a heat-resistant material. When forming a transferred layer 4 and an interlayer 3 as described later, a process temperature will increase depending on the types or formation processes (for example, from 350° C. to 1,000° C.) In such a case, if the substrate 1 has excellent heat resistance, the conditions for forming the films, such as a temperature, are widely changed in the formation of the transferred layer 4 and the like on the substrate 1.

When the maximum temperature in the formation of the transferred layer 4 is Tmax, it is preferable that the substrate 1 be composed of a material having a distortion point of Tmax. That is, it is preferable that the material for the substrate 1 has a distortion point of 350° C. or more, and more preferably 500° C. or more. Examples of such materials include heat-resistant glass, such as quartz glass, soda glass, Corning 7059, and OA-2 made by Nippon Electric Glass Co., Ltd.

When the process temperature is decreased in the formation of the separation layer 2, interlayer 3, and transferred layer 4, the substrate 1 can be composed of an inexpensive glass material or synthetic resin having a lower melting point.

Although the thickness of the substrate 1 is not limited, it is preferable that the thickness be generally about 0.1 to 5.0 mm, and more preferably 0.5 to 1.5 mm. A remarkably small thickness of the substrate 1 causes decreased mechanical strength, whereas an excessively large thickness causes a large loss-of the incident light 7 if the substrate 1 has a low transmittance. When the substrate 1 has a high transmittance for the incident light 7, the thickness may be larger than the above-mentioned upper limit.

It is preferable that the thickness of the substrate 1 at the portion for forming the separation layer be uniform for achieving uniform irradiation by the incident light 7. The inner surface 11 for exfoliation and the light-incident surface 12 of the substrate are not limited to the planar form, and may also be curved. In the present invention, the substrate 1 is not removed by etching etc., but the substrate 1 is removed by exfoliation in the separation layer 2 provided between the substrate 1 and the transferred layer 4, hence the operation is easy, and the substrate 1 has high selectivity, for example, a relatively high thickness.

The separation layer 2 will now be described. The separation layer 2 absorbs the incident light 7 to cause exfoliation in the layer and/or at an interface 2a or 2b (hereinafter referred to as "internal exfoliation" and "interfacial exfoliation"). Irradiation by the incident light 7 causes an elimination or reduction of the adhering force between atoms or molecules in the constituent substance of the separation layer 2, that is, ablation, and internal and/or interfacial exfoliation will occur as a result. Further, in some cases, gas will be released from the separation layer 2 by the incident light 7, resulting in the exfoliation. Consequently, there are two exfoliation mechanisms, that is, releasing components contained in the separation layer 2 as gas, and instantaneous vaporization of the separation layer 2 by absorption of the light followed by release of the vapor.

Examples of the composition for the separation layer 2 are the following (1) to (6):

(1) Amorphous silicon (a-Si):

Amorphous silicon may contain hydrogen (H). In this case, it is preferable that the hydrogen content be approximately 2 atomic percent or more, and more preferably 2 to 20 atomic percent. When a given amount of hydrogen is contained, hydrogen is released by irradiation of the incident light 7, and an internal pressure, which will act as a force for delaminating the upper and lower thin films, occurs in the separation layer 2. The hydrogen content in the amorphous silicon can be controlled by determining the film forming conditions, for example, the gas composition, gas pressures, gas atmospheres, gas flow rates, temperature, substrate temperature, and input power in the CVD process.

(2) Oxide ceramics, dielectrics (ferroelectrics) and semiconductors, such as silicon oxides and silicates, titanium oxides and titanates, zirconium oxide and zirconates, and lanthanum oxide and lanthanates:

Examples of silicon oxides include SiO, $SiO_2$, and $Si_3O_2$, and examples of silicates include $K_2SiO_3$, $Li_2SiO_3$, $CaSiO_3$, $ZrSiO_4$, and $Na_2SiO_3$. Examples of titanium oxides include TiO, $Ti_2O_3$, and TiO, and examples of titanates include $BaTiO_4$, $BaTiO_3$, $Ba_2Ti_9O_{20}$, $BaTi_5O_{11}$, $CaTiO_3$, $SrTiO_3$, $PbTiO_3$, $MgTiO_3$, $ZrTiO_2$, $SnTiO_4$, $Al_2TiO_5$, and $FeTiO_3$. Examples of zirconium oxides include $ZrO_2$, and examples of zirconates include $BaZrO_3$, $ZrSiO_4$, $PbZrO_3$, $MgZrO_3$, and $K_2ZrO_3$.

(3) Ceramics and dielectrics(ferroelectrics), such as PZT, PLZT, PLLZT and PBZT:

(4) Nitride ceramics, such as silicon nitride, aluminum nitride, and titanium nitride:

(5) Organic polymers:

Usable organic polymers have linkages (which are cut by irradiation of the incident light 7), such as —$CH_2$—, —CO— (ketone), —CONH— (amido), —NH— (imido), —COO— (ester), —N=N— (azo), and —CH=N— (isocyano). In particular, any organic polymers having large numbers of such linkages can be used. The organic polymers may have aromatic hydrocarbon (one or more benzene ring or fused ring) in the chemical formulae. Examples of the organic polymers include polyolefins, such as polyethylene, and polypropylene; polyimides; polyamides; polyesters; polymethyl methacrylate (PMMA); polyphenylene sulfide (PPS); polyether sulfone (PES); and epoxy resins.

(6) Metals:

Examples of metals include Al, Li, Ti, Mn, In, Sn, Y, La, Ce, Nd, Pr, Gd, and Sm; and alloys containing at least one of these metals.

The thickness of the separation layer 2 depends on various conditions, such as the purpose for exfoliation, the composition of the separation layer 2, the layer configuration, and the method for forming the layer, and has a thickness of generally about 1 nm to 20 µm, preferably about 10 nm to 2 µm, and more preferably about 40 nm to 1 µm. A significantly small thickness requires a larger amount of incident light 7 in order to secure excellent exfoliation characteristics of the separation layer 2, and an operational time for removing the separation layer 2 in the succeeding step. It is preferable that the thickness of the separation layer 2 be as uniform as possible.

The method for forming the separation layer 2 is not limited, and is determined depending on several conditions, such as the film composition and thickness. Examples of the methods include vapor phase deposition processes, such as CVD (including MOCVD, low pressure CVD, ECR-CVD), evaporation, molecular beam (MB) evaporation, sputtering, ion-plating, and PVD; plating processes, such as electro-plating, dip-plating (dipping), and electroless-plating; coating process, such as a Langmuir-Blodgett process, spin-coating process, spray-coating process, and roll-coating process; printing processes; transfer processes; ink-jet processes; and powder-jet processes. A combination of these processes may also be used. For example, when the separation layer 2 is composed of amorphous silicon (a-Si), it is preferable that the layer be formed by a low pressure CVD process or a plasma CVD process. Alternatively, when the separation layer 2 is composed of a ceramic by a sol-gel process, or an organic polymer, it is preferable that the layer be formed by a coating process, and particularly a spin-coating process. The separation layer 2 may be formed by two or more steps (for example, a layer-forming step and an annealing step).

Figure 2:
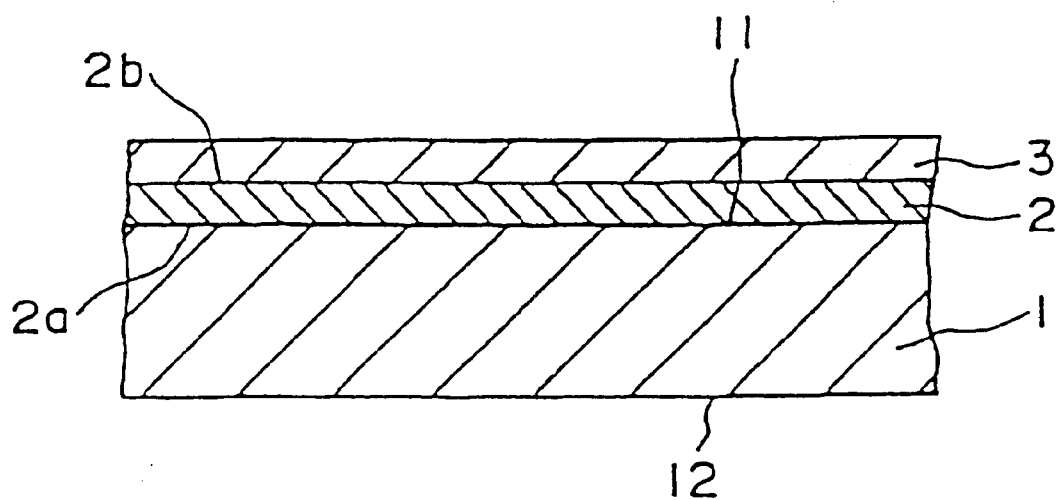

[2] As shown in FIG. 2, an interlayer (underlying layer) 3 is formed on the separation layer 2.

The interlayer 3 is formed for various purposes, for example, as a protective layer which physically and chemically protects the transferred layer 4 during production and use, an insulating layer, a conductive layer, a shading layer for the incident light 7, a barrier layer prohibiting migration of components to or from the transferred layer 4, and a reflection layer.

The composition of the interlayer 3 is determined by the purpose. For example, the interlayer 3, formed between the separation layer 2 composed of amorphous silicon and the transferred layer 4 including a thin film transistor, is composed of silicon oxides such as $SiO_2$. Alternatively, the interlayer 3, formed between the separation layer 2 and the transferred layer 4 including PZT, is composed of a metal, such as Pt, Au, W, Ta, Mo, Al, Cr, or Ti, or an alloy primarily containing such a metal. The thickness of the interlayer 3 is determined in response to the purpose and functions, and ranges generally from about 10 nm to 5 $\mu$m, and preferably about 40 nm to 1 $\mu$m. The interlayer 3 may be formed by the same method as for the separation layer 2. The interlayer 3 may be formed by two or more steps.

The interlayer 3 may include two or more layers having the same composition or different compositions. In the present invention, the transferred layer 4 may be formed directly on the separation layer 2 without forming the interlayer 3.

Figure 3:
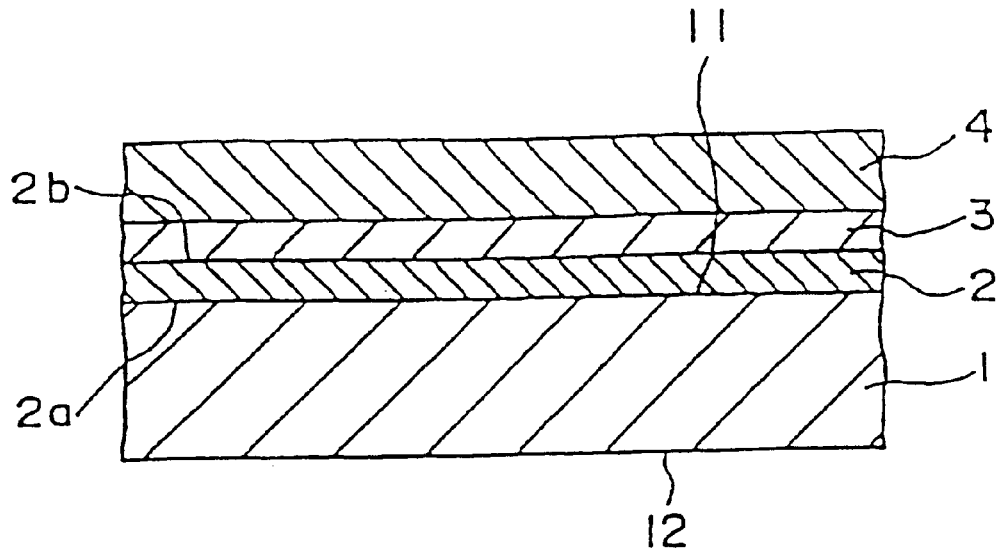

[3] As shown in FIG. 3, a transferred layer (detached member) is formed on the interlayer 3. The transferred layer 4 will be transferred onto a transfer member 6 later, and is formed by the same method as in the separation layer 2.

The purpose for forming the transferred layer 4, and type, shape, structure, composition, and physical and chemical characteristics of the transferred layer 4 are not limited, and it is preferable that the transferred layer 4 be a thin film, and particularly a functional thin film or thin film device. Examples of functional thin films and thin film devices include thin film transistors; thin film diodes; other thin film semiconductor devices; electrodes (e.g. transparent electrodes such as ITO and mesa films); photovoltaic devices used in solar batteries and image sensors; switching devices; memories; actuators such as piezoelectric devices; micromirrors (piezoelectric thin film ceramics); recording media such as magnetic recording media, magneto-optical recording media, and optical recording media; magnetic recording thin film heads, coils, inductors and thin film high permeability materials, and micro-magnetic devices composed of combinations thereof; optical thin films such as filters, reflection films, dichroic mirrors, and polarizers; semiconductor thin films; superconducting thin films, e.g. YBCO thin films; magnetic thin films; and multi-layered thin films, such as metallic multi-layered thin films, metallic-ceramic multi-layered thin films, metallic multi-layered semiconductor thin films, ceramic multi-layered semiconductor thin films, and multi-layered thin films including organic layers and other layers. Among them, application to thin film devices, micro-magnetic devices, three-dimensional microarticles, actuators, and micromirrors is useful.

Such a functional thin film or thin film device is formed by a relatively high process temperature because of the method for forming it. The substrate 1 must therefore be a highly reliable material which is resistant to the high process temperature, as described above.

The transferred layer 4 may be a single layer or a composite of a plurality of layers. The transferred layer, such as a thin film transistor, may have a given pattern. The formation (deposition) and patterning of the transferred layer 4 is performed by a predetermined process. The transferred layer 4 is generally formed by a plurality of steps.

The transferred layer 4 including thin film transistors is formed by, for example, the methods described in Japanese Patent Publication No. 2-50630, and H. Ohsima et al.: International Symposium Digest of Technical Papers SID 1983 "B/W and Color LC Video Display Addressed by Poly Si TFTs".

The thickness of the transferred layer 4 is not limited, and is determined in response to various factors, e.g. purpose, function; composition, and characteristics. When the transferred layer 4 includes thin film transistors, its total thickness is preferably 0.5 to 200 $\mu$m, and more preferably 0.5 to 10 $\mu$m. In the case of other thin films, the preferable thickness has a wider thickness range, for example, 50 nm to 1,000 $\mu$m.

The transferred layer 4 is not limited to the above-described thin films, and may be thick films, such as coating films and sheets, and transfer materials or separable materials, such as powder, not forming films or layers.

Figure 4:
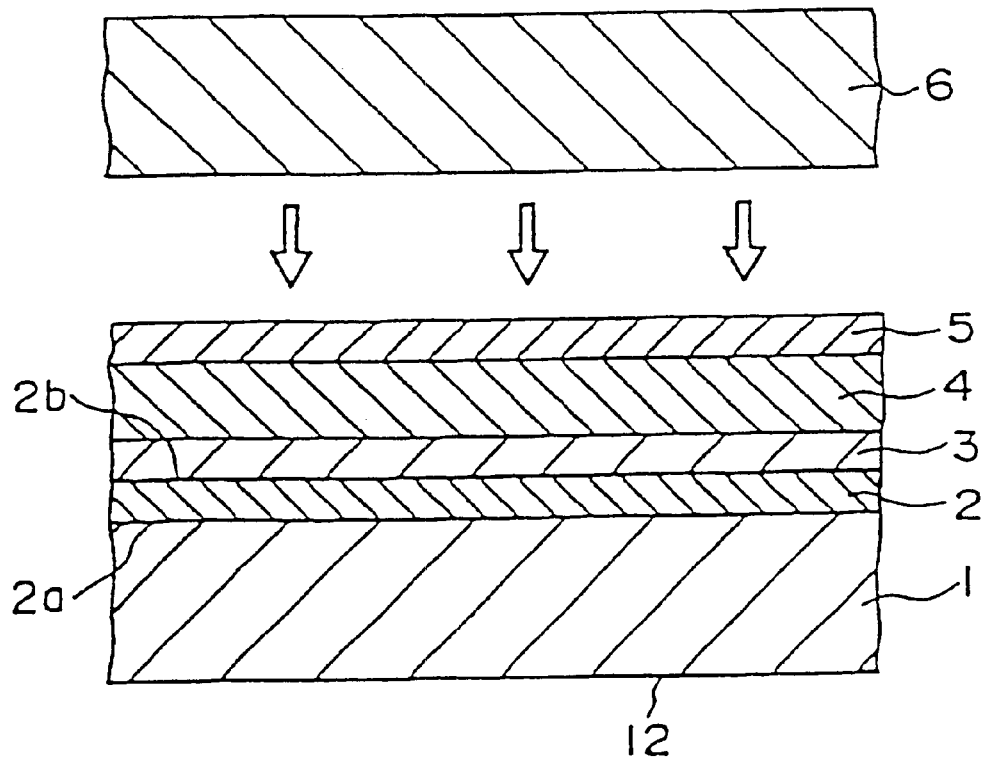

[4] As shown in FIG. 4, an adhesive layer 5 is formed on the transferred layer (a detached member) 4, and a transfer member 6 is adhered with the adhesive layer 5. Examples of preferable adhesives forming the adhesive layer 5 include curable adhesives, for example, reactive curing adhesives, heat-hardening adhesives, photo-setting adhesives such as UV-curing adhesives, and anaerobic curing adhesives. Examples of types of adhesives include epoxys, acrylates, and silicones. The adhesive layer 5 is formed by, for example, a coating process.

When using a curable adhesive, for example, the curable adhesive is applied onto the transferred layer 4, the transfer member 6 is adhered thereon, and then the curable adhesive is cured by a method in response to characteristics of the curable adhesive to adhere the transferred layer 4 to the transfer member 6. When using a photo-setting adhesive, it is preferable that a transparent transfer member 6 be placed on the uncured adhesive layer 5, and then the substrate 1 and the transfer member 6 be illuminated with light for curing from both sides in order to secure the curing of the adhesive.

Regardless of the drawings, the adhesive layer 5 may be formed on the transfer member 6 and then the transferred layer 4 may be adhered thereto. Further, the above-mentioned interlayer may be provided between the transferred layer 4 and the adhesive layer 5. When the transfer member 6 has an adhering function, the formation of the adhesive layer 5 may be omitted.

Examples of the transfer member 6 include substrates (plates), and particularly transparent substrates, although they are not limited to these substrates. Such substrates may be planar or curved. The transfer member 6 may have inferior characteristics including heat resistance and corrosion resistance to those of the substrate 1, because, in the present invention, the transferred layer 4 is formed on the substrate 1, and the transferred layer 4 is transferred to the transfer member 6, wherein characteristics required for the transfer member 6 are independent of the conditions, such as temperature, in the formation of the transferred layer 4.

Accordingly, when the maximum temperature in the formation of the transferred layer 4 is Tmax, the transfer member 6 can be formed of a material having a glass transition point (Tg) or softening point of Tmax or less. For example, the transfer member 6 is composed of a material having a glass transition point (Tg) or softening point of 800° C. or less, preferably 500° C. or less and more preferably 320° C. or less.

It is preferable that the transfer member 6 has a given level of rigidity (mechanical strength), but it may have flexibility or elasticity. Examples of materials for such a transfer member 6 include a wide variety of synthetic resins and glass materials, and preferably synthetic resins and inexpensive glass materials (with low melting points).

Examples of synthetic resins include both thermoplastic resins and thermosetting resins, such as polyolefins, e.g. polyethylene, polypropylene, ethylene-propylene copolymers, and ethylene-vinyl acetate copolymers (EVAs); cyclic polyolefins; modified polyolefins; polyvinyl chloride; polyvinylidene chloride; polystyrene; polyamides; polyamide-imides; polycarbonates; poly-(4-methylpentene-1); ionomers; acrylic resins; polymethyl methacrylate (PMMA); acrylonitrile-butadiene-styrene copolymers (ABS resins); acrylonitrile-styrene copolymers (AS resins); butadiene-styrene copolymers; polyoxymethylene; polyvinyl alcohol (PVA); ethylene-vinyl alcohol copolymers (EVOHs); polyesters, e.g. polyethylene terephthalate (PET), polybutylene terephthalate (PBT), and polycyclohexane terephthalate (PCT); polyethers; polyether-ketones (PEKs); polyether-ether-ketone (PEEKs); polyether-imides; polyacetals (POMs); polyphenylene oxides; modified polyphenylene oxides; polysulfones; polyphenylene sulfide (PPS); polyether sulfones (PESs); polyarylates; aromatic polyesters (liquid crystal polymers); polytetrafluoroethylene; polyvinylidene fluoride; other fluorine resins; thermoplastic elastomers, e.g. styrene-, polyolefin-, polyvinyl chloride-, polyurethane-, polyester-, polyamide-, polybutadiene-, trans-polyisoprene-, fluorine rubber-, and chlorinated polyethylene-type; epoxy resins; phenol resins; urea resins; melamine resins; unsaturated polyesters; silicone resins; and polyurethanes; and copolymers, blends, and polymer alloys essentially consisting of these synthetic resins. One or more of these synthetic resins may be used, for example, as a composite consisting of at least two layers.

Examples of usable glasses include silicate glass (quartz glass), alkaline silicate glass, soda-lime glass, lead (alkaline) glass, barium glass, and borosilicate glass. All the types of glass other than silicate glass have lower boiling points than that of silicate glass, can be readily formed and shaped, and are inexpensive.

When a synthetic resin is used, a large transfer member 6 provided with a complicated shape, such as a curved surface or unevenness, can be readily formed with low material and production costs. A large, inexpensive device, for example, a liquid crystal display, can therefore be readily formed.

The transfer member 6 may function as an independent device, such as a liquid crystal cell, or as a part of a device, for example, a color filter, an electrode layer, a dielectric layer, an insulating layer, and a semiconductor device. Further, the transfer member 6 may be composed of metal, ceramic, stone, wood, or paper. Alternatively, it may be a surface of a given article (the surface of a watch, clock, air conditioner, or print board), or a surface of a given structure, such as a wall, pillar, post, beam, ceiling, or window glass.

Figure 5:
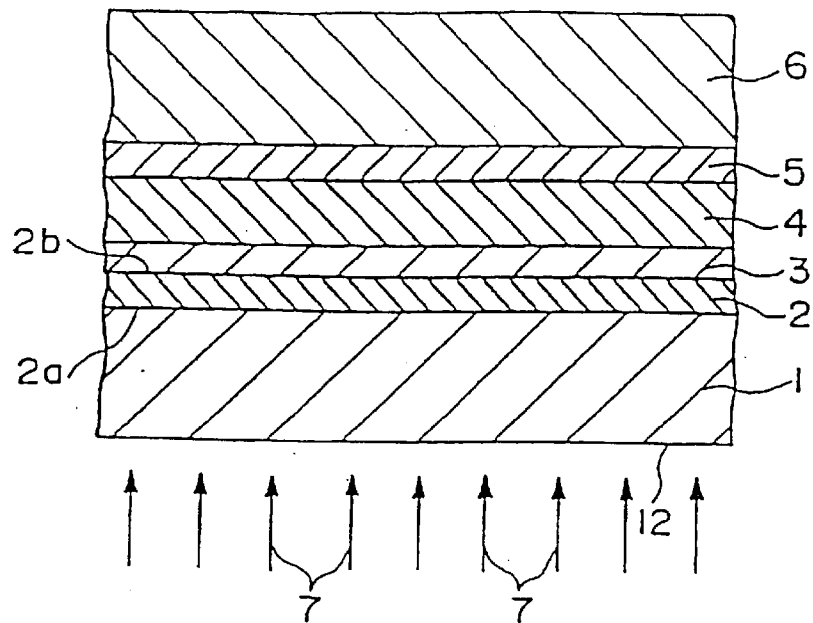
Figure 6:
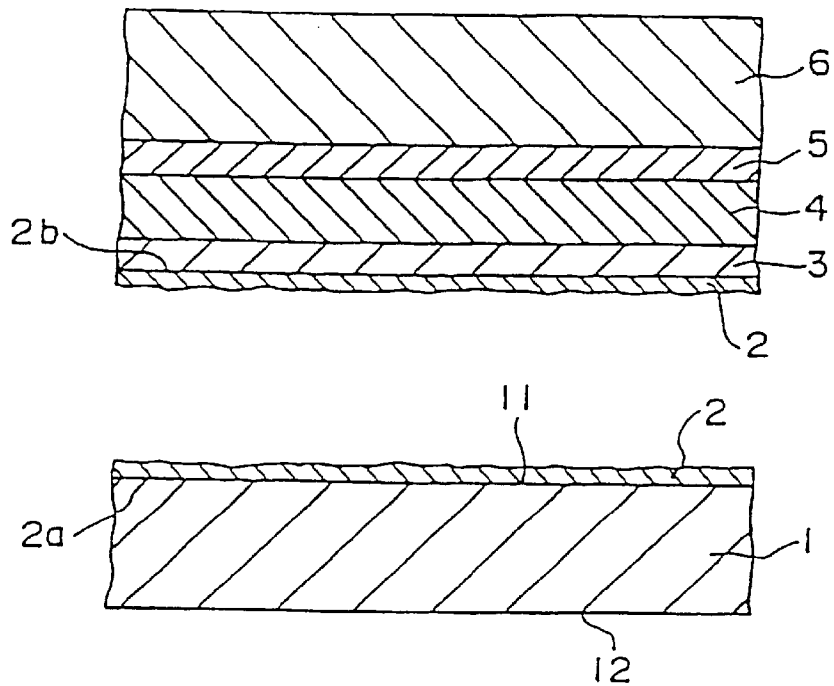
Figure 7:
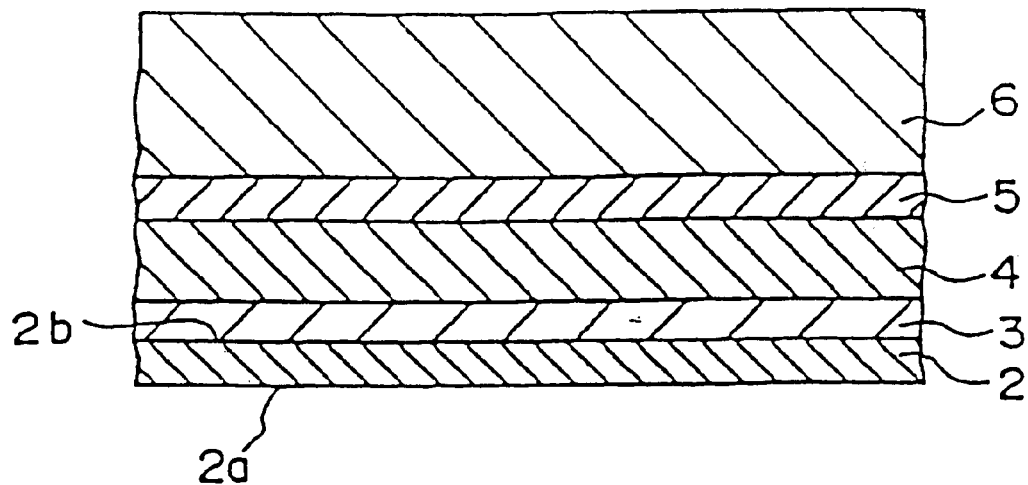
Figure 7:
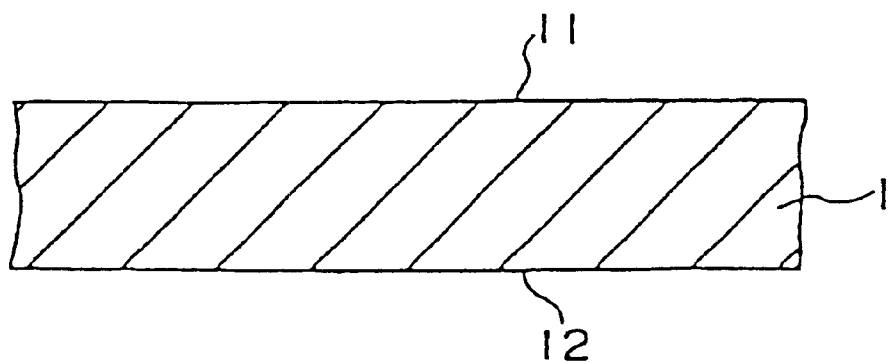

[5] As shown in FIG. 5, the rear side of the substrate 1 (the side 12 of the incident light) is irradiated with the incident light 7. The incident light 7 passes though the substrate 1 and enters the separation layer 2 through the interface 2a. As shown in FIG. 6 or FIG. 7, internal and/or interfacial exfoliation occurs in the separation layer and the adhering force is reduced or eliminated. When separating the substrate 1 from the transfer member 6, the transferred layer 4 is detached from the substrate 1 and transferred to the transfer member 6.

FIG. 6 shows a state of the internal exfoliation in the separation layer 2, and FIG. 7 shows a state of the interfacial exfoliation at the interface 2a on the separation layer 2. The occurrence of the internal and/or interfacial exfoliation presumes that ablation of the constituents in the separation layer 2 occurs, that gas retained in the separation layer 2 is released, and that phase transition such as melting or vaporization occurs immediately after the light irradiation.

The word "ablation" means that solid components (the constituents of the separation layer 2), which absorbed the incident light, are photochemically and thermally excited and atoms or molecules in the solid components are released by the chain scission. The ablation is observed as phase transition such as melting or vaporization in the partial or entire constituents of the separation layer 2. Also, fine foaming may be formed by the phase transition, resulting in a decreased adhering force. The internal and/or interfacial exfoliation of the separation layer 2 depends on the composition of the separation layer 2 and other factors, for example, the type, wavelength, intensity and, range of the incident light 7.

Any type of incident light 7, which causes internal and/or interfacial exfoliation of the separation layer 2, can be used, for example, X-rays, ultraviolet rays, visible rays, infrared rays (heat rays), laser beams, milli-waves, micro-waves, electron rays, and radiations ($\alpha$-rays, $\beta$-rays, and $\gamma$-rays). Among them, laser beams are preferable because they can easily cause exfoliation (ablation) of the separation layer 2.

Examples of lasers generating the laser beams include gas lasers and solid lasers (semiconductor lasers), and excimer lasers, Nd-YAG lasers, Ar lasers, $CO_2$ lasers, CO lasers, and He—Ne lasers may be preferably used. Among them excimer lasers are more preferably used. The excimer lasers output high energy laser beams in a shorter wavelength range which cause ablation in the separation layer 2 within a significantly shorter time. The separation layer 2 is therefore cleaved substantially without the temperature rise, and thus without deterioration or damage of the adjacent or adjoining interlayer 3, transferred layer 4, and substrate 1.

If the ablation of the separation layer 2 is dependent on the wavelength of the incident light, it is preferable that the wavelength of the incident laser beam be approximately 100 nm to 350 nm.

When exfoliating the separation layer 2 by means of phase transition, for example, gas evolution, vaporization, or sublimation, it is preferable that the wavelength of the incident laser beam be approximately 350 nm to 1,200 nm.

Preferably, the energy density of the incident light, and particularly of the excimer lasers ranges from approximately 10 to 5,000 mJ/cm$^2$, and more preferably approximately 100 to 1,000 mJ/cm$^2$. The irradiation time preferably ranges from 1 to 1,000 nsec., and more preferably from 10 to 200 nsec. At an energy density or irradiation time which is lower than the lower limit, satisfactory ablation will not occur, whereas at an energy density or irradiation time which is higher than the upper limit, the transferred layer 4 is adversely affected by the incident light passing through the separation layer 2 and interlayer 3.

It is preferable that the incident light 7 including laser beams with a uniform intensity be incident on the separation layer. The incident light 7 may be incident on the separation layer 2 from the direction perpendicular to the separation layer 2 or from a direction shifted by a given angle from the perpendicular direction.

When the separation layer 2 has an area which is larger than the area per scanning of the incident light, the entire separation layer 2 may be irradiated with several scans of incident light. The same position may be irradiated two or more times. The same position or different positions may be irradiated with different types and/or wavelengths of incident (laser) light beams two or more times.

Figure 8:
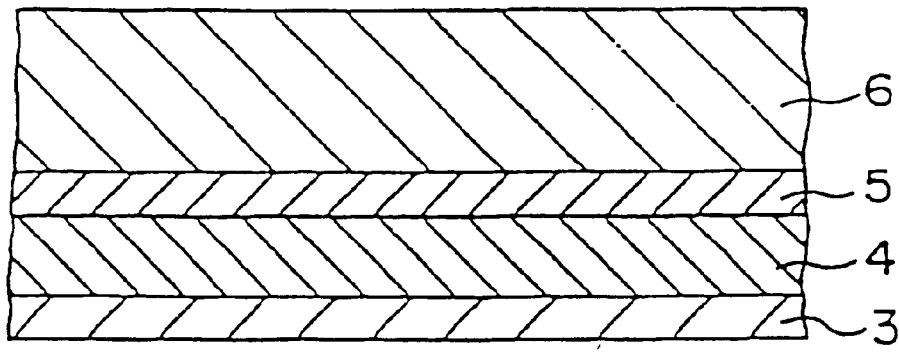

[6] As shown in FIG. 8, the separation layer 2 remaining on the interlayer 3 is removed by, for example, washing, etching, ashing or polishing, or a combination of these methods. Also, the separation layer 2 remaining on the substrate 1 is removed in the internal separation of the separation layer 2, as shown in FIG. 6.

When the substrate 1 is composed of an expensive or rare material, such as quartz glass, the substrate 1 is preferably reused. In other words, the present invention is applicable to the substrate to be reused, hence it is useful.

The transfer of the transferred layer 4 to the transfer member 6 is completed by the above-mentioned steps. Removal of the interlayer 3 adjoining the transferred layer 4 or formation of additional layers may be employed.

In the present invention, the transferred layer 4 is not directly separated as the detached member, but the separation layer 2 adhered to the transferred layer 4 is exfoliated, hence uniform exfoliation or transfer is easily, securely, and uniformly achieved regardless of characteristics and conditions of the detached member (transferred layer 4). Since the detached member (transferred layer 4) is not damaged, it can maintain high reliability.

In the embodiment shown in the drawings, a method for transferring the transferred layer 4 onto the transfer member 6 is described. The exfoliating method in accordance with the present invention does not always include such transfer. In this case, a detached member is used instead of the transferred layer 4. The detached member may be either a layered material or non-layered material.

The detached member may be used for various purposes, for example, removal (trimming) of unnecessary portions of the thin film (particularly functional thin film), removal of attached members, such as dust, oxides, heavy metals, and carbon, and recycling of the substrate used in the exfoliation method.

The transfer member 6 may be composed of a material having quite different properties from that of the substrate 1 (regardless of transparency), for example, various types of metal, ceramic, carbon, paper, and rubber, as well as the above-described materials. When the transfer member 6 does not permit or is not suitable for direct formation of the transferred layer 4, the present invention can be usefully applied.

In the embodiment shown in the drawings, the incident light 7 is incident on the substrate 1, however, it may be incident on the side away from the substrate 1 when the adhered material (detached member) is removed or when the transferred layer 4 is not adversely affected by irradiation with the incident light.

Although the exfoliating method in accordance with the present invention has been described, the present invention is not limited to the description.

For example, the surface of the separation layer 2 may be irradiated with the incident light to form a given pattern such that the transferred layer 4 is cleaved or transferred based on the pattern (a first method). In this case, in the above-mentioned step [5], the side 12 of the incident light of the substrate 1 is masked in response to the pattern before irradiation of the incident light 7, or the positions irradiated with the incident light 7 are accurately controlled.

The separation layer 2 having a given pattern may be formed instead of forming the separation layer 2 on the entire face 11 of the substrate 1 (a second method). In this case, the separation layer 2 having a given pattern is formed by masking etc. or the separation layer 2 is formed on the entire surface 11 and is patterned or trimmed by etching etc.

According to the first and second methods, the transferred layer 4 is simultaneously transferred and patterned or trimmed.

Transfer processes may be repeated two or more times by the same procedure. When the transfer processes are performed for an even numbers of times, the positions of the front and rear faces of the transferred layer formed by the last transfer process are the same as those of the transferred layer formed on the substrate 1 by the first transfer process.

On a large transparent substrate (for example, having an effective area of 900 mm by 1,600 mm) as a transfer member 6, transferred layers 4 (thin film transistors) formed on small substrates 1 (for example, having an effective area of 45 mm by 40 mm) may be transferred side by side by repeating transfer cycles (for example, approximately 800 cycles), so that the transferred layers 4 are formed on the entire effective area of the large transparent substrate. A liquid crystal display having a size which is the same as that of the large transparent substrate can be produced.

Examples of the first embodiment will now be described.

EXAMPLE 1

A quartz substrate with a length of 50 mm, a width of 50 mm, and a thickness of 1.1 mm (softening point: 1,630° C., distortion point: 1,070° C., and transmittance of excimer laser: approximately 100%) was prepared, and an amorphous silicon (a-Si) film as a separation layer (laser-absorption layer) was formed on the one side of the quartz substrate by a low pressure CVD process ($Si_2H_6$ gas, 425° C.). The thickness of the separation layer was 100 nm.

A $SiO_2$ film as an interlayer was formed on the separation layer by an ECR-CVD process ($SiH_4+O_2$ gas, 100° C.). The thickness of the interlayer was 200 nm.

A polycrystalline silicon (or polycrystalline silicon) film with a thickness of 50 nm as a transferred layer was formed on the interlayer by a CVD process ($Si_2H_6$ gas). The polycrystalline silicon film was patterned to form source/drain/channel regions of a thin film transistor. After a $SiO_2$ gate insulating film was formed by thermal oxidation of the surface of the polycrystalline silicon film, a gate electrode (a structure in which a high melting point metal, such as Mo, was deposited on the polycrystalline silicon) was formed on the gate insulating film, and source and drain regions were formed by self alignment by means of ion implantation using the gate electrode as a mask. A thin film transistor was thereby formed.

A thin film transistor having similar characteristics can be formed by a low temperature process instead of such a high temperature process. For example, an amorphous silicon film with a thickness of 50 nm as a transferred layer was formed on a $SiO_2$ film as an interlayer on the separation layer by a low pressure CVD process ($Si_2H_6$ gas, 425° C.), and the amorphous silicon film was irradiated with laser beams (wavelength: 308 nm) to modify the amorphous silicon into a polycrystalline silicon film by crystallization. The polycrystalline silicon film was patterned to form source/drain/channel regions having a given pattern of a thin film transistor. After a $SiO_2$ gate insulating film was deposited on the polycrystalline silicon film by a low pressure CVD process, a gate electrode (a structure in which a high melting point metal, such as Mo, was deposited on the polycrystalline silicon) was formed on the gate insulating film, and source and drain regions were formed by self alignment by means of ion implantation using the gate electrode as a mask. A thin film transistor was thereby formed.

Next, electrodes and leads connected to the source and drain regions and leads connected to the gate electrode were formed, if necessary. These electrodes and leads are generally composed of aluminum, but not for the limitation. A metal (not melted by laser irradiation in the succeeding step) having a melting point higher than that of aluminum may be used if melting of aluminum is expected in the succeeding laser irradiation step.

A UV-curable adhesive (thickness: 100 μm) was applied onto the thin film transistor, a large, transparent glass substrate (soda glass, softening point: 740° C., distortion point: 511° C.) as a transfer member was adhered to the adhesive film, and the outer surface of the glass substrate was irradiated with ultraviolet rays to fix these layers by curing the adhesive.

The surface of the quartz substrate was irradiated with Xe—Cl excimer laser beams (wavelength: 308 nm) to cause exfoliations (internal and interfacial exfoliation) of the separation layer. The energy density of the Xe—Cl excimer laser was 300 mJ/cm$^2$, and the irradiation time was 20 nano seconds. The excimer laser irradiation methods include a spot-beam irradiation method and a line-beam irradiation method. In the spot-beam irradiation method, a given unit area (for example 8 mm by 8 mm) is irradiated with a spot beam, and the spot irradiation is repeated while shifting the spot beam by about one-tenth the given unit area. In the line-beam irradiation, a given unit area (for example 378 mm by 0.1 mm, or 378 mm by 0.3 mm (absorbing 90% or more of the incident energy)) is irradiated while shifting the line-beam by about one-tenth the given unit area. Each of the points of the separation layer is thereby irradiated at least ten times. The entire surface of the quartz substrate is irradiated with the laser, while shifting step by step over the irradiated area.

Next, the quartz substrate was detached from the glass substrate (transfer member) at the separation layer, so that the thin film transistor and interlayer formed on the quartz substrate were transferred onto the glass substrate.

The separation layer remaining on the interlayer on the glass substrate was removed by etching, washing, or a combination thereof. A similar process was applied to the quartz substrate for recycling the substrate.

When the glass substrate as the transfer member is larger than the quartz substrate, the transfer from the quartz substrate to the glass substrate in accordance with this example can be repeated to form a number of thin film transistors on different positions on the quartz substrate. A larger number of thin film transistors can be formed on the glass substrate by repeated deposition cycles.

EXAMPLE 2

A thin film transistor was transferred as in Example 1, but an amorphous silicon film containing 20 atomic percent of hydrogen (H) was formed as the separation layer. The hydrogen content in the amorphous silicon film was controlled by the film deposition conditions in the low pressure CVD.

EXAMPLE 3

A thin film transistor was transferred as in Example 1, but a ceramic thin film (composition: $PbTiO_3$, thickness: 200 nm) as the separation layer was formed by spin-coating and sol-gel processes.

EXAMPLE 4

A thin film transistor was transferred as in Example 1, but a ceramic thin film (composition: $BaTiO_3$, thickness: 400 nm) as the separation layer was formed by a sputtering process.

EXAMPLE 5

A thin film transistor was transferred as in Example 1, but a ceramic thin film (composition: $Pb(Zr,Ti)O_3$ (PZT), thickness: 50 nm) as the separation layer was formed by a laser ablation process.

EXAMPLE 6

A thin film transistor was transferred as in Example 1, but a polyimide film (thickness: 200 nm) as the separation layer was formed by a spin-coating process.

EXAMPLE 7

A thin film transistor was transferred as in Example 1, but a polyphenylene sulfide film (thickness: 200 nm) as the separation layer was formed by a spin-coating process.

EXAMPLE 8

A thin film transistor was transferred as in Example 1, but an aluminum film (thickness: 300 nm) as the separation layer was formed by a sputtering process.

EXAMPLE 9

A thin film transistor was transferred as in Example 2, but Kr—F excimer laser beams (wavelength: 248 nm) were used as the incident light. The energy density of the laser beams was 250 mJ/cm$^2$, and the irradiation time was 20 nano seconds.

EXAMPLE 10

A thin film transistor was transferred as in Example 2, but Nd-YAG laser beams (wavelength: 1,068 nm) were used as the incident light. The energy density of the laser beams was 400 mJ/cm$^2$, and the irradiation time was 20 nano seconds.

EXAMPLE 11

A thin film transistor was transferred as in Example 1, but a polycrystalline silicon film (thickness: 80 nm) as the transferred layer was formed by a high temperature process at 1,000° C.

EXAMPLE 12

A thin film transistor was transferred as in Example 1, but a transparent polycarbonate substrate (glass transition point: 130° C.) as the transfer member was used.

EXAMPLE 13

A thin film transistor was transferred as in Example 2, but a transparent AS resin substrate (glass transition point: 70 to 90° C.) as the transfer member was used.

EXAMPLE 14

A thin film transistor was transferred as in Example 3, but a transparent polymethyl methacrylate substrate (glass transition point: 70 to 90° C.) as the transfer member was used.

EXAMPLE 15

A thin film transistor was transferred as in Example 5, but a transparent polyethylene terephthalate substrate (glass transition point: 67° C.) as the transfer member was used.

EXAMPLE 16

A thin film transistor was transferred as in Example 6, but a transparent high-density polyethylene substrate (glass transition point: 77 to 90° C.) as the transfer member was used.

EXAMPLE 17

A thin film transistor was transferred as in Example 9, but a transparent polyamide substrate (glass transition point: 145° C.) as the transfer member was used.

EXAMPLE 18

A thin film transistor was transferred as in Example 10, but a transparent epoxy resin substrate (glass transition point: 120° C.) as the transfer member was used.

EXAMPLE 19

A thin film transistor was transferred as in Example 11, but a transparent polymethyl methacrylate substrate (glass transition point: 70 to 90° C.) as the transfer member was used.

The thin film transistors transferred in Examples 1 to 19 were observed visually and with a microscope. All the thin film transistors were uniformly transferred without forming defects and unevenness.

As described above, an exfoliating method in accordance with the present invention ensures easy and secure exfoliation regardless of characteristics and conditions of the detached member (transferred layer), and enables transfer onto various transfer members. For example, a thin film can be formed by transfer on a material not capable of or not suitable for the direct forming of the thin film, an easily formable material, an inexpensive material, and a large article which is difficult to move.

Materials having thermal and corrosion resistance which is inferior to that of the substrate, for example, various synthetic resins, and low melting point glass materials, can be used as the transfer member. For example, in the production of a liquid crystal display including thin film transistors (particularly polycrystalline silicon TFTs) formed on a transparent substrate, a large, inexpensive liquid crystal display can be easily produced by a combination of a heat-resisting quartz glass substrate as the substrate, and an inexpensive and formable transparent substrate composed of a synthetic resin or a low melting point glass as the transfer member. Such an advantage will be expected in production of other devices other than the liquid crystal display.

A transferred layer such as a functional thin film can be formed on a heat-resisting substrate with high reliability, such as a quartz substrate, followed by patterning, with maintaining the above-mentioned advantage. A highly reliable thin film can therefore be formed on a transfer member regardless of the properties of the transfer member.

Second Embodiment

An exfoliating method in accordance with the second embodiment of the present invention will now be described in detail with reference to the attached drawings. In the second embodiment, the separation layer 2 of the first embodiment has a layered structure including a plurality of layers.

FIGS. 9 to 16 are cross-sectional views illustrating steps in accordance with this embodiment in the exfoliating method in accordance with the present invention. The steps will be described sequentially with reference to these drawings. Since many matters are common to the first embodiment, the same parts are identified by the same numeral and a detailed description will be omitted appropriately. Accordingly, matters which are different from the first embodiment will be described.

Figure 9:
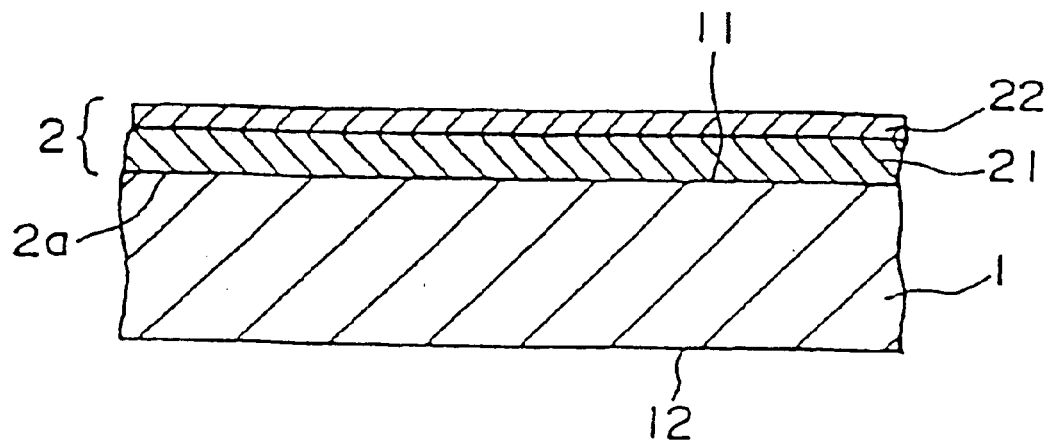
FIGS. 9 to 16 are cross-sectional views of steps in a second embodiment of an exfoliating method in accordance with the present invention.

[1] As shown in FIG. 9, a separation layer 2 composed of a composite including a plurality of sub-layers is formed on one face (the face 11) of the substrate 1. In this case, each sub-layer in the separation layer 2 is deposited step by step onto the substrate 1 by a method described below. Preferably, the substrate 1 is composed of a transparent material transmitting the incident light 7, when the light is incident on the outer surface of the substrate 1.

In this case, the transmittance for the incident light 7 is similar to that in the first embodiment. Materials for the substrate 1 are common to the first embodiment. The thickness of the substrate 1 is the same as that in the first embodiment. It is preferable that the thickness of the substrate 1 be uniform at a region for forming the separation layer so as to be uniformly irradiated with the incident light 7. The inner surface 11 and light-incident surface 12 of the substrate 1 may be planar or curved.

In the present invention, the substrate 1 is detached by exfoliating the separation layer 2 between the substrate 1 and the transferred layer 4 instead of removing the substrate by etching etc., hence the operation can be easily performed, and the substrate 1 has a wide range of selectivity, for example, use of a relatively thick substrate.

The separation layer 2 is now described. The separation layer 2 absorbs the incident light 7 to cause internal and/or interfacial exfoliation of the layer. The separation layer 2 includes at least two-sub layers having different compositions or characteristics, and preferably an optical absorption layer 21 and other layers having a composition and characteristics which are different from the optical absorption layer 21. It is preferable that the other layer be a shading layer (reflection layer 22) for shading the incident light. The shading layer lies on the side (upper side in the drawings) of the optical absorption layer 21 away from the incident light 7, reflects or absorbs the incident light 7 to prevent or suppress entry of the incident light into the transferred layer 4.

In this embodiment, a reflection layer 22 reflecting the incident light 7 is formed as the shading layer. It is preferable that the reflection layer 22 has a reflectance of 10% or more, and more preferably 30% or more for the incident light 7. Preferably, such a reflection layer 22 is formed of a metallic thin film including a singularity or plurality of sub-layers, or a composite including a plurality of thin films having different refractive indices. In particular, it is composed of metallic thin films in view of easy formability.

Examples of metals suitable for forming a metallic thin film include Ta, W, Mo, Cr, Ni, Co, Ti, Pt, Pd, Ag, Au, and Al; and alloys primarily containing at least one of these metals. Examples of preferable elements to be added to such alloys include Fe, Cu, C, Si, and B. The addition of these elements enables control of the thermal conductivity and reflectance of the alloy. Another advantage is easy production of a target, when forming the reflection layer by physical deposition. Further, alloys can be easily obtained and are inexpensive compared with the relevant pure metals.

The thickness of the reflection (shading layer) 22 is preferably 10 nm to 10 $\mu$m, and more preferably 50 nm to 5 $\mu$m, although it is not limited to such a range. An excessive thickness requires much time for the formation of the reflection layer 22 and the removal of the reflection layer 22 which will be performed later. A significantly low thickness may cause insufficient shading effects in some film compositions.

The optical absorption layer 21 contributing to the exfoliation of the separation layer 2 absorbs the incident light 7 to eliminate or reduce inter-atomic or inter-molecular adhering forces in the substances in the optical absorption layer 21 and to cause internal and/or interfacial exfoliation due to an ablation phenomenon. Further, the irradiation with the incident light 7 may cause exfoliation by the evolution of gas from the optical absorption layer 21. A component contained in the optical absorption layer 21 is released as gas in one case, or the separation layer 2 is instantaneously gasified by absorbing the light, and the vapor is released to contribute to the exfoliation in the other case.

The usable compositions of such an optical absorption layer 21 are similar to the compositions (1) to (4) which were described in the separation layer 2 of the first embodiment. In the second embodiment, the following compositions can also be used as the optical absorption layer 21.

(5) Organic Polymers:

Usable organic polymers have linkages (which are cut by irradiation of the incident light 7), such as —CH—, —CH$_2$—, —CO— (ketone), —CONH— (amido), —NH— (imido), —COO— (ester), —N=N— (azo), and —CH=N— (isocyano). In particular, any organic polymers having large amounts of such linkages can be used. Examples of the organic polymers include polyolefins, such as polyethylene, and polypropylene; polyimides; polyamides; polyesters; polymethyl methacrylate (PMMA); polyphenylene sulfide (PPS); polyether sulfone (PES); and epoxy resins.

(6) Metals:

Examples of metals include Al, Li, Ti, Mn, In, Sn, and rare earth metals, e.g. Y, La, Ce, Nd, Pr, Sm, and Gd; and alloys containing at least one of these metals.

(7) Hydrogen Occluded Alloys:

Examples of hydrogen occluded alloys include rare earth element-based alloys, such as LaNi$_5$; and Ti- or Ca-based alloys, in which hydrogen is occluded.

(8) Nitrogen Occluded Alloys:

Examples of nitrogen occluded alloys include rare earth element-iron, -cobalt, -nickel, and -manganese alloys, such as Sm—Fe and Nd—Co alloys, in which nitrogen is occluded.

The thickness of the optical absorption layer 21 depends on various factors, for example, the purpose of the exfoliation, the composition of the separation layer 2, the layer configuration, and the formation process, and is generally 1 nm to 20 $\mu$m, and preferably 10 nm to 2 $\mu$m, and more preferably 40 nm to 1 $\mu$m. A significantly low thickness of the optical absorption layer 21 causes deterioration of uniformity of the deposited film, and thus irregular exfoliation, whereas an excessive thickness requires a large amount of incident light 7 (power) to ensure satisfactory exfoliation and a longer operational time for removing the separation layer 2. It is preferable that the thicknesses of the optical absorption layer 21 and reflection layer 22 be uniform as much as possible. For the same reasons, the total thickness of the separation layer 2 is preferably 2 nm to 50 $\mu$m, and more preferably 20 nm to 20 $\mu$m.

The method for forming each layer in the separation layer 2 (in this embodiment, the optical absorption layer 21 and reflection layer 22) is not limited, and is selected in view of various factors, such as the composition and thickness of the film. Examples of the methods include vapor phase deposition processes, such as CVD (including MOCVD, low pressure CVD, ECR-CVD), evaporation, molecular beam (MB) evaporation, sputtering, ion-plating, and PVD; plating processes, such as electro-plating, dip-plating (dipping), and electroless-plating; coating process, such as a Langmuir-Blodgett process, spin-coating process, spray-coating process, and roll-coating process; printing processes; transfer processes; ink-jet processes; and powder-jet processes. A combination of these processes may also be usable. The process for forming the optical absorption layer 21 and reflection layer 22 may be the same or different, and is determined by the composition etc.

For example, when the optical absorption layer 21 is composed of amorphous silicon (a-Si), it is preferable that the layer be formed by a low pressure CVD process or a plasma CVD process. Alternatively, when the optical absorption layer 21 is composed of a ceramic by a sol-gel process, or an organic polymer, it is preferable that the layer be formed by a coating process, and particularly a spin-coating process.

The reflection layer 22 composed of a metallic thin film is preferably formed by evaporation, molecular beam (MB) evaporation, laser ablation deposition, sputtering, ion plating, and the above-mentioned plating processes.

Each layer in the separation layer 2 may be formed by two or more steps, for example, including a layer-forming step and an annealing step.

Figure 10:
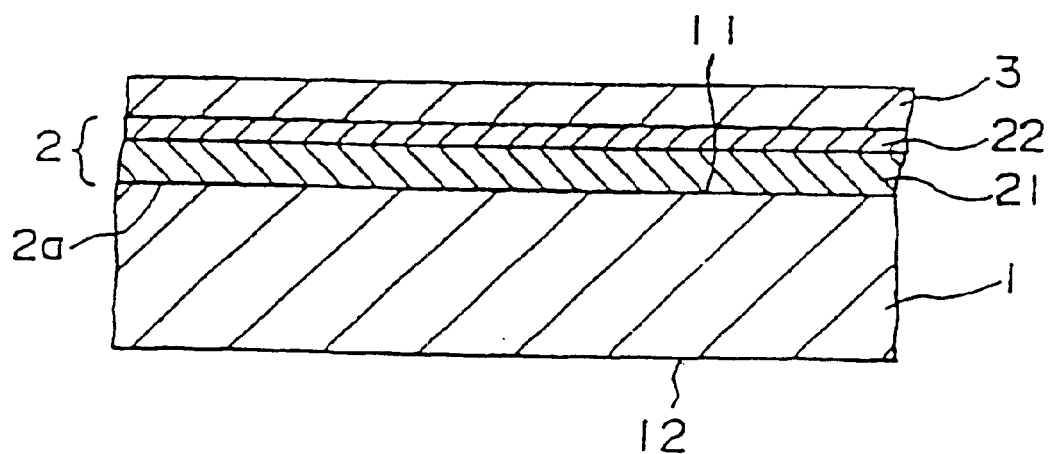

[2] As shown in FIG. 10, an interlayer (underlying layer) 3 is formed on the separation layer 2.

The interlayer 3 is formed for various purposes, and functions as at least one layer of, for example, a protective layer which protects physically or chemically a transferred layer 4 in production and in use, an insulating layer, a conductive layer, a shading layer of the incident light 7, a barrier layer inhibiting migration of any components from or to the transferred layer 4, and a reflection layer.

The composition of the interlayer 3 is determined based on the purpose: For example, the interlayer 3, which is formed between the separation layer 2 with the amorphous silicon optical absorption layer 21 and the transferred layer 4 as the thin film transistor, is composed of silicon oxide, e.g. SiO$_2$, or the interlayer 3 formed between the separation layer 2 and the PZT transferred layer 4 is composed of a metal, e.g. Pt, Au, W, Ta, Mo, Al, Cr, or Ti, or an alloy primarily containing such a metal.

The thickness of the interlayer 3 is similar to that in the first embodiment. The method for forming the interlayer 3 is also similar to that in the first embodiment. The interlayer 3 may be composed of two or more layers having the same composition or different compositions. Alternatively, in the present invention, the transferred layer 4 may be directly formed on the separation layer 2 without forming the interlayer 3.

Figure 11:
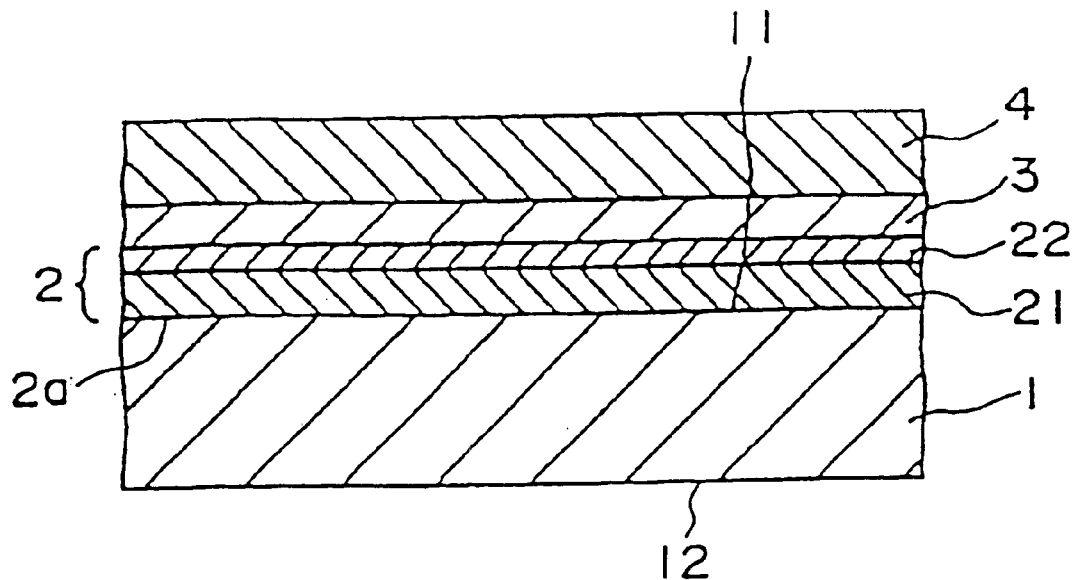

[3] As shown in FIG. 11, a transferred layer (detached member) 4 is formed on the interlayer 3. The transferred layer 4 is transferred onto a transfer member 6 which will be described later, and formed by a method similar to that for the separation layer 2. The purpose for forming, type, shape, structure, composition, and physical and chemical characteristics of the transferred layer 4 are not limited, and it is preferable that the transferred layer 4 be a functional thin film or a thin film device in view of the purpose and usefulness of the transfer. Examples of the functional thin films and thin film devices have been described in the first embodiment.

Such a functional thin film or thin film device is generally formed at a relatively high process temperature in connection with the manufacturing method. As described above, therefore, the substrate 1 must be highly reliable and resistive to such a high process temperature.

The transferred layer 4 may be composed of a single layer or a plurality of layers. Additionally, it may be patterned as in the above-described thin film transistor. The formation (deposition) and patterning of the transferred layer 4 is performed by a given process according to demand. Such a transferred layer 4 is generally formed by a plurality of steps. The thickness of the transferred layer 4 is also similar to that in the first embodiment.

Figure 12:
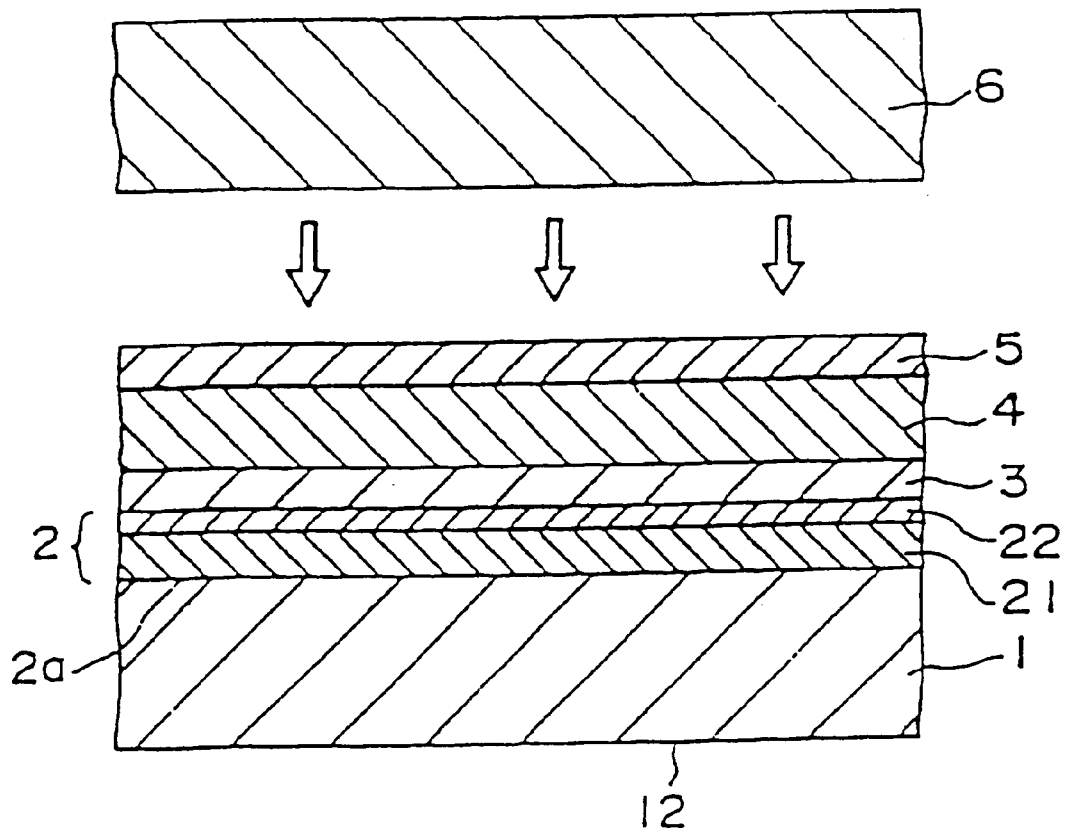

[4] As shown in FIG. 12, an adhesive layer 5 is formed on the transferred layer (exfoliation layer) 4 to adhere with the transfer member 6 through the adhesive layer 5. Preferred examples of adhesives for forming the adhesive layer 5 are identical to those in the first embodiment. When using a curable adhesive, the curable adhesive is applied onto the transferred layer 4, a transfer member 6 described later is adhered thereto, the curable adhesive is cured by a curing method in response to the property to adhere the transferred layer 4 with the transfer member 6. In the case using a photo-setting adhesive, it is preferable that a transparent transfer member 6 be placed on the adhesive layer 5, and then the transfer member 6 be irradiated with light to cure the adhesive. When the substrate 1 is transparent, both the substrate 1 and the transfer member 6 are preferably irradiated with light to secure curing of the adhesive.

Instead of the state shown in the drawings, the adhesive layer 5 may be formed on the side of the transfer member 6, and the transferred layer 4 may be formed thereon. Further, the above-mentioned interlayer may be formed between the transferred layer 4 and the adhesive layer 5. When, for example, the transfer member 6 has a function as an adhesive, the formation of the adhesive layer 5 can be omitted.

Examples, materials, and characteristics of the transfer member 6 are identical to those in the first embodiment.

Figure 13:
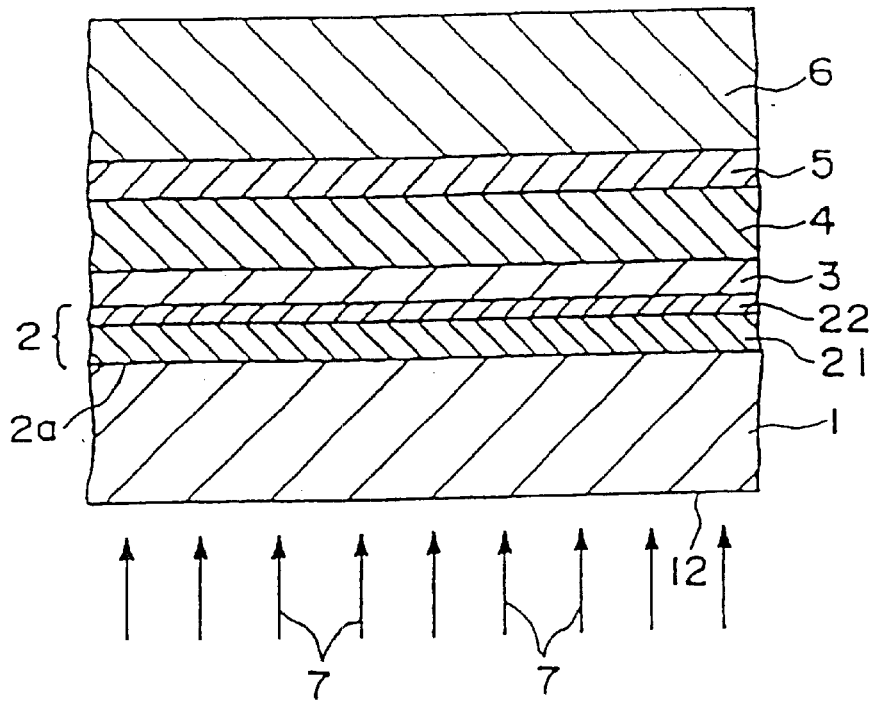

[5] As shown in FIG. 13, the rear side (the incident face 12) of the substrate 1 is irradiated with the incident light 7. After the incident light 7 passes through the substrate 1, it is radiated to the separation layer 2 through the interface 2a. In detail, it is absorbed in the optical absorption layer 21, the part of the incident light 7 not absorbed in the optical absorption layer 21 is reflected by the reflection layer 22 and passes through the optical absorption layer 21 again. The adhering force in the separation layer is reduced or eliminated by the internal and/or interfacial exfoliation, and as shown in FIG. 14 or 15, the transferred layer 4 is detached from the substrate and transferred onto the transfer member 6 when the substrate 1 is separated from the transfer member 6.

Figure 14:
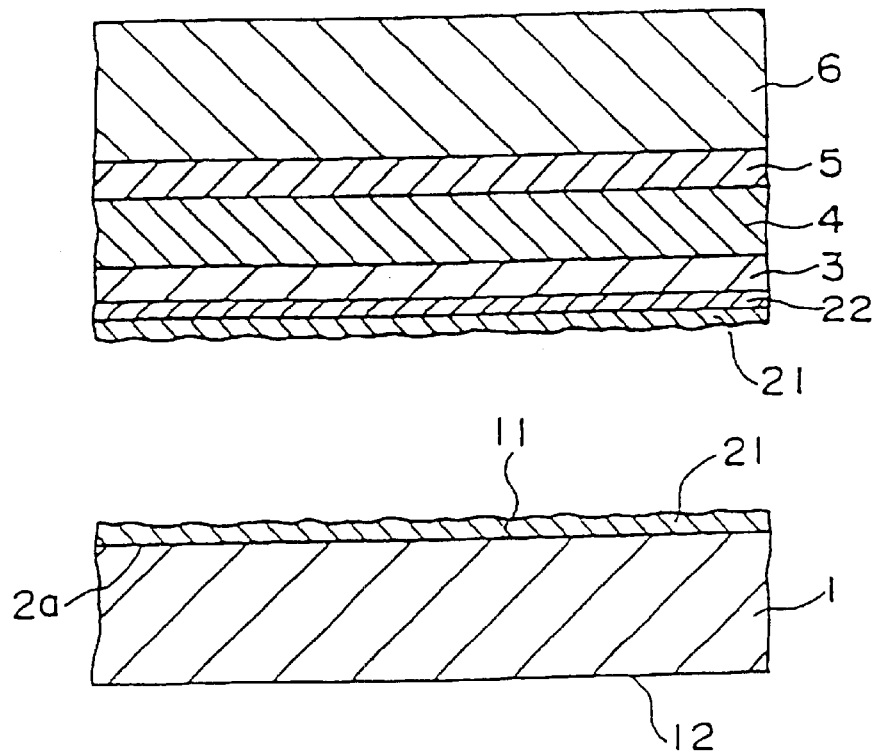
Figure 15:
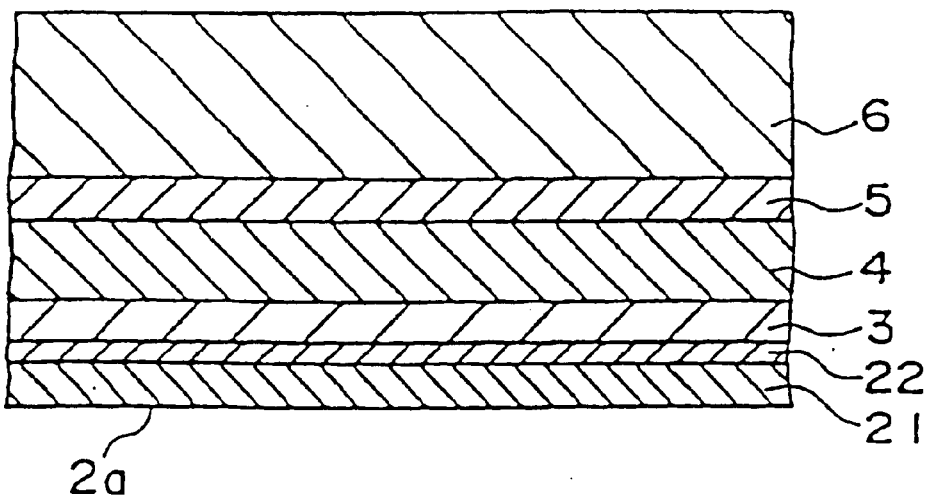
Figure 15:
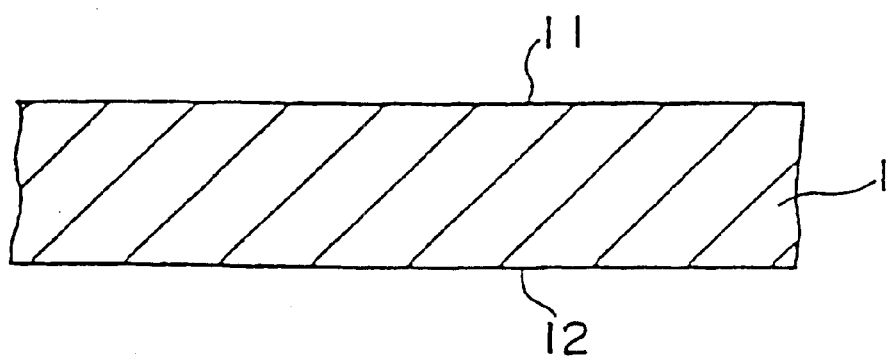

FIG. 14 shows a case of internal exfoliation of the separation layer 2, and FIG. 15 shows a case of interfacial exfoliation at the interface 2a of the separation layer 2. It is presumed from the occurrence of an internal and/or interfacial exfoliation that ablation of the constituents in the optical absorption layer 21 occurs, that gas retained in the optical absorption layer 21 is released, and that phase change such as melting or vaporization occurs immediately after the irradiation of the light.

Wherein the word "ablation" means that solid components (the constituents of the optical absorption layer 21), which absorbed the incident light, are photochemically and thermally excited and atoms and molecules in the solid components are released by the chain scission. The ablation is observed as phase transition such as melting or vaporization in the partial or entire constituents of the optical absorption layer 21. Also, fine foaming may be formed by the phase change, resulting in a reduced adhering force. The internal and/or interfacial exfoliation of the separation layer 21 depends on the layer configuration of the separation layer 2, the composition and thickness of the optical absorption layer 21 and other factors, for example, the type, wavelength, intensity and, range of the incident light 7.

Examples of types of the incident light 7 and of apparatuses for generating it are identical to those in the first embodiment.

When the ablation in the optical absorption layer 21 depends on the wavelength of the incident light, it is preferable that the wavelength of the incident laser light ranges from approximately 100 nm to 350 nm. When exfoliating the separation layer 2 by the phase transition such as gas evolution, vaporization, and sublimation, the wavelength of the incident laser light preferably ranges from approximately 350 nm to 1,200 nm. The energy density of the incident laser light, and particularly of the excimer laser light preferably ranges from approximately 10 to 5,000 $mJ/cm^2$, and more preferably from 100 to 1,000 $mJ/cm^2$. The preferable irradiation time ranges from 1 to 1,000 nano seconds, and more preferably 10 to 100 nano seconds. A lower energy density or a shorter irradiation time may cause insufficient ablation, whereas a higher energy density or a longer irradiation time may cause excessive breakage of the separation layer 2. It is preferable that the incident light 7 such as laser light be incident such that the intensity is uniform.

The direction of the incident light 7 is not limited to the direction perpendicular to the separation layer 2, and may be shifted by several degrees from the perpendicular direction. If the area of the separation layer 2 is larger than the irradiation area per scan of the incident light, the entire region of the separation layer 2 may be irradiated two or more times at the same position. Alternatively, the same position or different positions may be irradiated with different types or different wavelengths (wavelength regions) of the incident light (laser light).

In this embodiment, the reflection layer 22 is provided at the side of the optical absorption layer 21 away from the substrate 1, hence the optical absorption layer 21 can be effectively irradiated with the incident light 7 without any loss. Further, the irradiation of the transferred layer 4 with the incident light 7 can be prevented by the shading characteristics of the reflection layer (shading layer), preventing adverse effects, such as the modification and deterioration of the transferred layer 4.

In particular, since the optical absorption layer 21 is irradiated with the incident light without loss, the energy density of the incident light 7 can be reduced, or in other words, the irradiation area per scan can be increased; a given area of the separation layer 2 can therefore be exfoliated at decreased irradiation times as an advantage in the production process.

Figure 16:
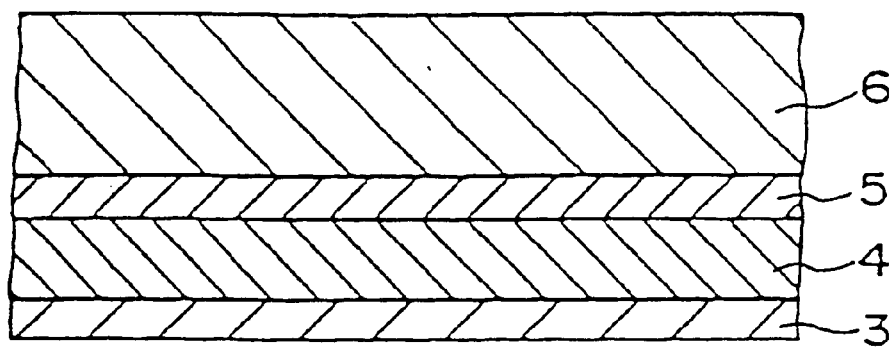

[6] As shown in FIG. 16, the separation layer 2 remaining on the interlayer 3 is removed by, for example, washing, etching, ashing, or polishing, or a combination thereof. In the internal exfoliation of the separation layer 2 shown in FIG. 14, the optical absorption layer 21 remaining on the substrate 1 can also be removed if necessary.

When the substrate 1 is composed of an expensive or rare material such as quartz glass, it is preferable that the substrate 1 be reused (recycled). In other words, the present invention is applicable to a substrate to be reused, and thus is highly useful.

The transfer of the transferred layer 4 onto the transfer member 6 is completed by these steps. The removal of the interlayer 3 adjoining the transferred layer 4 and formation of an additional layer may be incorporated.

The configuration of the separation layer 2 is not limited to that shown in the drawings, and may include that comprising a plurality of optical absorption layers which have at least one different property among the composition, thickness, and characteristics of the layer. For example, the separation layer 2 may be composed of three layers including a first optical absorption layer, a second optical absorption layer, and a reflection layer provided therebetween.

The interfaces between the sub-layers forming the separation layer 2 are not always clearly provided, the composition of the layer, and the concentration, molecular structure, and physical and chemical properties of a given component may continuously change (may have a gradient) near the interface.

In this embodiment shown in the drawings, the transfer of the transferred layer 4 onto the transfer member 6 is described, such transfer is not always incorporated in the exfoliating method in accordance with the present invention.

The exfoliating member can be used for various purposes as described in the first embodiment. Various transfer members 6 other than that described above can also be used as in the first embodiment.

When the adhered member (detached member) is removed or when the transferred layer 4 is not adversely affected by the incident light 7, the incident light 7 is not always incident on the substrate 1, and may be incident on the side away from the substrate 1. In this case, it is preferable that the optical absorption layer 21 and the reflection layer 22 have a reversed positional relationship in the separation layer 2.

The exfoliating method in accordance with the present invention has been described with reference to this embodiment shown in the drawings, the present invention, however, is not limited to this, and permits various modifications as in the first embodiment (please refer to the description concerning the modifications in the first embodiment).

Examples of the second embodiment will now be described.

EXAMPLE 1

A quartz substrate with a length of 50 mm, a width of 50 mm, and a thickness of 1.1 mm (softening point: 1,630° C., distortion point: 1,070° C., and transmittance of excimer laser: approximately 100%) was prepared, and a separation layer having a double-layered structure including an optical absorption layer and a reflecting layer was formed on one side of the quartz substrate.

An amorphous silicon (a-Si) film as the optical absorption layer was formed by a low pressure CVD process ($Si_2H_6$ gas, 425° C.). The thickness of the optical absorption layer was 100 nm. A metallic thin film composed of Ta as the reflecting layer was formed on the optical absorption layer by a sputtering process. The thickness of the reflection layer was 100 nm, and the reflectance of the laser light was 60%.

A $SiO_2$ film as an interlayer was formed on the separation layer by an ECR-CVD process ($SiH_4+O_2$ gas, 100° C.). The thickness of the interlayer was 200 nm.

An amorphous silicon film with a thickness of 60 nm as a transferred layer was formed on the interlayer by a low pressure CVD process ($Si_2H_6$ gas, 425° C.), and the amorphous silicon film was irradiated with laser light beams (wavelength: 308 nm) to modify the amorphous silicon film into a polycrystalline silicon film by crystallization. The polycrystalline silicon film was subjected to patterning and ion plating to form a thin film transistor.

A UV-curable adhesive (thickness: 100 $\mu$m) was applied onto the thin film transistor, a large, transparent glass substrate (soda glass, softening point: 740° C., distortion point: 511° C.) as a transfer member was adhered to the adhesive film, and the outer surface of the glass substrate was irradiated with ultraviolet rays to fix these layers by curing the adhesive.

The surface of the quartz substrate was irradiated with Xe—Cl excimer laser beams (wavelength: 308 nm) to cause exfoliation (internal and interfacial exfoliation) of the separation layer. The energy density of the Xe—Cl excimer laser was 160 mJ/cm$^2$, and the irradiation time was 20 nano seconds. The excimer laser irradiation methods include a spot-beam irradiation method and a line-beam irradiation method. In the spot-beam irradiation method, a given unit area (for example 10 mm by 10 mm) is irradiated with a spot beam, and the spot irradiation is repeated while shifting the spot beam by about one-tenth the given unit area. In the line-beam irradiation, a given unit area (for example 378 mm by 0.1 mm, or 378 mm by 0.3 mm (absorbing 90% or more of the incident energy)) is irradiated with while shifting the line-beam by about one-tenth the given unit area. Each of the points of the separation layer is thereby irradiated at least ten times. The entire surface of the quartz substrate is irradiated with the laser, while shifting step by step the irradiated area.

Next, the quartz substrate was detached from the glass substrate (transfer member) at the separation layer, so that the thin film transistor and interlayer were transferred onto the glass substrate.

The separation layer remaining on the interlayer on the glass substrate was removed by etching, washing, or a combination thereof. A similar process was applied to the quartz substrate for recycling the substrate.

EXAMPLE 2

A thin film transistor was transferred as in Example 1, but an amorphous silicon film containing 18 atomic percent of hydrogen (H) was formed as the optical absorption layer. The hydrogen content in the amorphous silicon film was controlled by the film deposition conditions in the low pressure CVD.

EXAMPLE 3

A thin film transistor was transferred as in Example 1, but a ceramic thin film (composition: $PbTiO_3$, thickness: 200 nm) as the optical absorption layer was formed by spin-coating and sol-gel processes.

EXAMPLE 4

A thin film transistor was transferred as in Example 1, but a ceramic thin film (composition: $BaTiO_3$, thickness: 400 nm) as the optical absorption layer, and a metallic thin film composed of aluminum (thickness: 120 nm, reflectance of laser light: 85%) as the reflection layer were formed by a sputtering process.

EXAMPLE 5

A thin film transistor was transferred as in Example 1, but a ceramic thin film (composition: $Pb(Zr,Ti)O_3$ (PZT), thickness: 50 nm) as the optical absorption layer was formed by a laser ablation process, and a metallic thin film (thickness: 80 nm, reflectance of laser light: 65%) composed of an Fe—Cr alloy was formed by a sputtering process.

EXAMPLE 6

A thin film transistor was transferred as in Example 1, but a polyimide film (thickness: 200 nm) as the optical absorption layer was formed by a spin-coating process.

EXAMPLE 7

A thin film transistor was transferred as in Example 1, but a praseodymium (Pr) film (rare earth metal film) (thickness: 500 nm) as the optical absorption layer was formed by a sputtering process.

EXAMPLE 8

A thin film transistor was transferred as in Example 2, but Kr—F excimer laser beams (wavelength: 248 nm) were used as the incident light. The energy density of the laser beams was 180 $mJ/cm^2$, and the irradiation time was 20 nano seconds.

EXAMPLE 9

A thin film transistor was transferred as in Example 2, but Ar laser beams (wavelength: 1,024 nm) were used as the incident light. The energy density of the laser beams was 250 $mJ/cm^2$, and the irradiation time was 50 nano seconds.

EXAMPLE 10

A thin film transistor was transferred as in Example 1, but a polycrystalline silicon film (thickness: 90 nm) as the transferred layer was formed by a high temperature process, at 1,000° C.

EXAMPLE 11

A thin film transistor was transferred as in Example 2, but a polycrystalline silicon film (thickness: 80 nm) as the transferred layer was formed by a high temperature process at 1,030° C.

EXAMPLE 12

A thin film transistor was transferred as in Example 4, but a polycrystalline silicon film (thickness: 80 nm) as the transferred layer was formed by a high temperature process at 1,030° C.

EXAMPLES 13 TO 20

A series of thin film transistors were transferred as in Examples 12 to 19 of the first embodiment.

The thin film transistors transferred in Examples 1 to 20 were observed visually and with a microscope. All the thin film transistors were uniformly transferred without forming defects and unevenness.

As described above, the second embodiment in accordance with the present invention has advantages shown in the first embodiment, the transferred layer, such as a thin film transistor, is prevented from adverse affects by the transmission of the incident light when the separation layer includes a shading layer, and particularly a reflection layer, and the separation layer is more effectively exfoliated by the use of the reflecting light from the reflection layer.

Third Embodiment

An exfoliating method in accordance with the third embodiment of the present invention will now be described in detail with reference to the attached drawings. In the third embodiment, a thin film device is used as the detached member or the transferred layer in the first embodiment.

FIGS. 17 to 22 are cross-sectional views illustrating steps in accordance with this embodiment in the exfoliating method in accordance with the present invention. Each of the steps of the exfoliating method (transferring method) will be described with reference to these drawings. Since many matters are common to the first embodiment, the same parts are identified by the same numerals and a detailed description will be omitted appropriately. Accordingly, matters which are different from the first embodiment will be described.

Figure 17:
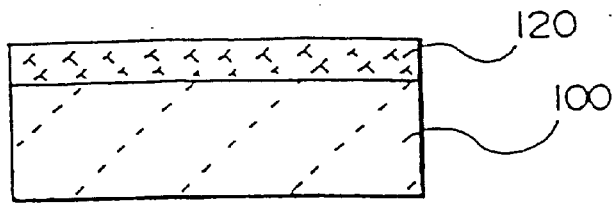
FIGS. 17 to 22 are cross-sectional views of steps in a third embodiment of a method for transferring a thin film device in accordance with the present invention.

[Step 1] As shown in FIG. 17, a separation layer (optical absorption layer) is formed on a substrate 100. The substrate 100 and the separation layer 120 will be described.

(1) Description of the Substrate 100

Preferably, the substrate 100 is composed of a transparent material which transmits light. The light transmittance is identical to the first embodiment. Also, the material and the thickness of the substrate 100 are identical to the first embodiment.

(2) Description of the Separation Layer 120

The separation layer 120 absorbs the incident light to cause internal and/or interfacial exfoliation, and preferably is composed of a material in which inter-atomic or inter-molecular adhering forces are reduced or eliminated by light irradiation to cause internal and/or interfacial exfoliation based on ablation.

Further, gas causing exfoliating effects may be released from the separation layer 120 by light irradiation in some cases, that is, a case in which components contained in the separation layer 120 are released as gas, and a case in which the separation layer 120 is instantanecusly gasified by absorbing the incident light and the released vapor contributes to exfoliation. The composition of such a separation layer 120 is similar to that in the first embodiment.

Also, the thickness of the separation layer 120 and the method for forming it are similar to those in the first embodiment.

Figure 18:
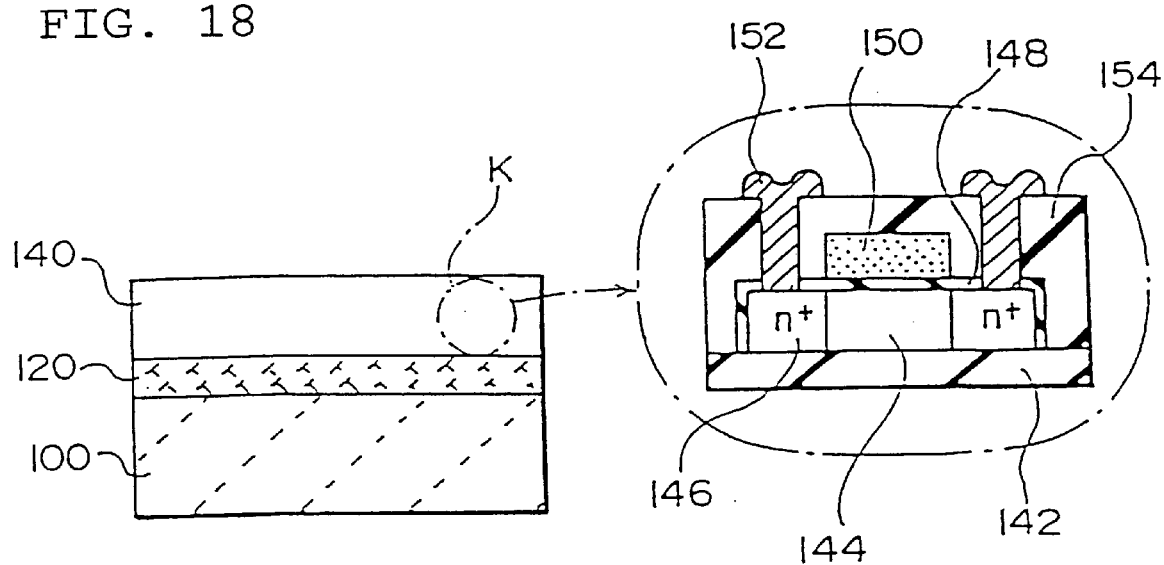

[Step 2] Next, as shown in FIG. 18, a transferred layer (thin film device layer) 140 is formed on the separation layer 120. An enlarged cross-sectional view of the portion K (surrounded by a dotted line in FIG. 18) of the thin film device layer 140 is shown in the right side of FIG. 18. As shown in the drawing, the thin film device layer 140 is composed of a TFT (thin film transistor) formed on a $SiO_2$ film (interlayer) 142, and the TFT includes source and drain layers 146 composed of an n-doped polycrystalline silicon layer, a channel layer 144, a gate insulating film 148, a gate electrode 150, an insulating interlayer 154, and an electrode composed of, for example, aluminum.

In this embodiment, although the interlayer adjoining the separation layer 120 is composed of a $SiO_2$ film, it may be composed of any other insulating film, such as $Si_3N_4$. The thickness of the $SiO_2$ film (interlayer) is adequately determined based on the purpose for the formation and its functions, and ranges generally from approximately 10 nm to 5 $\mu$m, and preferably 40 nm to 1 $\mu$m. The interlayer is formed for various purposes, and functions as at least one of a protective layer physically or chemically protecting the transferred layer 140, an insulating layer, a conductive layer, a shading layer to laser light, a barrier layer for preventing migration, and a reflection layer.

In some cases, the transferred layer (thin film device layer) 140 may be directly formed on the separation layer 120, by omitting the formation of the interlayer, such as the $SiO_2$ film.

The transferred layer (thin film device layer) 140 includes a thin film device such as a TFT, as shown in the right side of FIG. 18. As well as a TFT, other thin film devices shown in the first embodiment can also be used. These thin film devices are generally formed at a relatively high process temperature inherent to the formation method. Thus, as described above, the substrate 100 must have high reliability and must be resistant to the process temperature.

Figure 19:
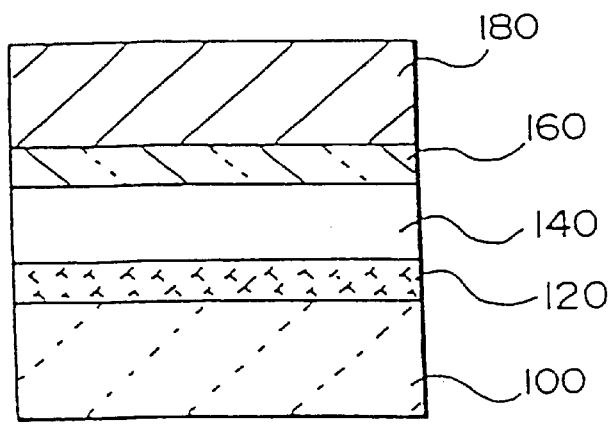

[Step 3] As shown in FIG. 19, the thin film device layer 140 is adhered to a transfer member 180 using an adhesive layer 160. Preferable examples of adhesives forming the adhesive layer 160 are described in the first embodiment.

When using a curable adhesive, for example, the curable adhesive is applied onto the transferred layer (thin film device layer) 140, the transfer member 180 is adhered thereto, the curable adhesive is cured by a curing method in response to the property to adhere the transferred layer (thin film device layer) 140 with the transfer member 180. In the case where a photo-setting adhesive is used, the outer surface of the transparent substrate 100 or transparent transfer member 180 (or both outer surfaces of the transparent substrate and transparent transfer member) is irradiated with light. A photo-setting adhesive, which barely affects the thin film device layer, is preferably used as the adhesive.

Instead of the method shown in the drawing, the adhesive layer 160 may be formed on the transfer member 180 and the transferred layer (thin film device layer) 140 may be adhered thereto. Alternatively, the formation of the adhesive layer 160 can be omitted when the transfer member 180 has adhesive characteristics.

Examples of the transfer members 180 are described in the first embodiment.

Figure 20:
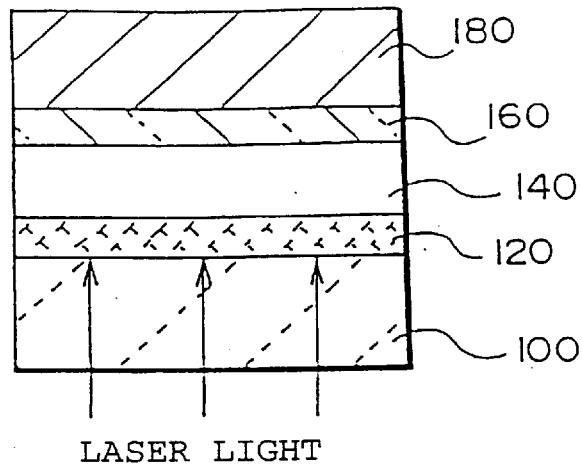

[Step 4] As shown in FIG. 20, the rear side of the substrate 100 is irradiated with light. The light passing through the substrate 100 is incident on the separation layer 120. As a result, internal and/or interfacial exfoliation, which reduces or eliminates the adhering forces, occurs. It is presumed from the occurrence of the internal and/or interfacial exfoliation in the separation layer 120 that ablation of the constituents in the separation layer 120 occurs, that gas retained in the separation layer 120 is released, and that phase transition such as melting or vaporization occurs immediately after the light irradiation.

The word "ablation" has the same meaning as in the first embodiment.

The incident light is identical to the light used in the first embodiment. In particular, excimer lasers are preferably used. The excimer lasers output high energy laser beams in a shorter wavelength range which cause ablation in the separation layer 120 within a significantly shorter time. The separation layer 120 is therefore cleaved substantially without the temperature rise, and thus without deterioration or damage of the adjacent or adjoining transfer member 180, and substrate 100.

If the ablation of the separation layer 120 is dependent on the wavelength of the incident light, it is preferable that the wavelength of the incident laser beam be approximately 100 nm to 350 nm.

Figure 23:
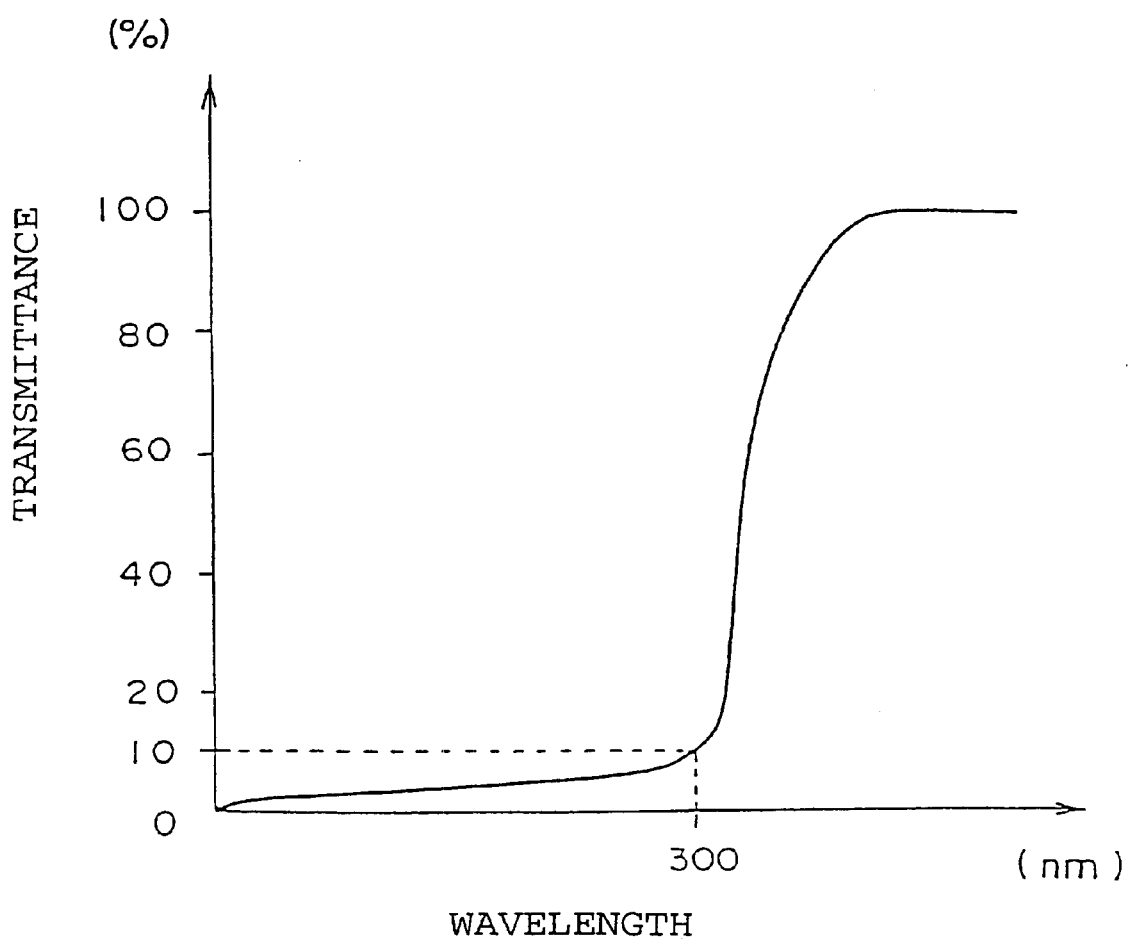
FIG. 23 is a graph illustrating a change in the transmittance of a first substrate (a substrate 100 in FIG. 17) to the wavelength of laser light.

FIG. 23 is a graph of transmittance vs. wavelength of light in the substrate 100. As shown in the graph, the transmittance increases steeply at a wavelength of 300 nm. In such a case, light beams having a wavelength of higher than 300 nm (for example, Xe—Cl excimer laser beams having a wavelength of 308 nm) are used. When exfoliating the separation layer 120 by means of phase transition, for example, gas evolution, vaporization, or sublimation, it is preferable that the wavelength of the incident laser beam be approximately 350 nm to 1,200 nm.

The energy density of the incident laser light beam, and particularly of the excimer laser light beam, is similar to that in the first embodiment.

When the light passing through the separation layer 120 reaches the transferred layer 140 and adversely affects the layer, a metallic film 124 composed of tantalum (Ta) etc. may be formed on the separation layer (laser absorption layer) 120. The laser light passing through the separation layer 120 is completely reflected on the interface with the metallic film 124, and thus does not affect the thin film device provided on the metallic film. It is preferable that the intensity of the incident light such as laser light be uniform. The direction of the incident light is not always perpendicular to the separation layer 120, and may be shifted by a given angle from the perpendicular direction.

If the area of the separation layer 120 is larger than the irradiation area per scan of the incident light, the entire region of the separation layer 120 may be irradiated two or more times at the same position. Alternatively, the same position or different positions may be irradiated with different types or different wavelengths (wavelength regions) of the incident light (laser light).

Figure 21:
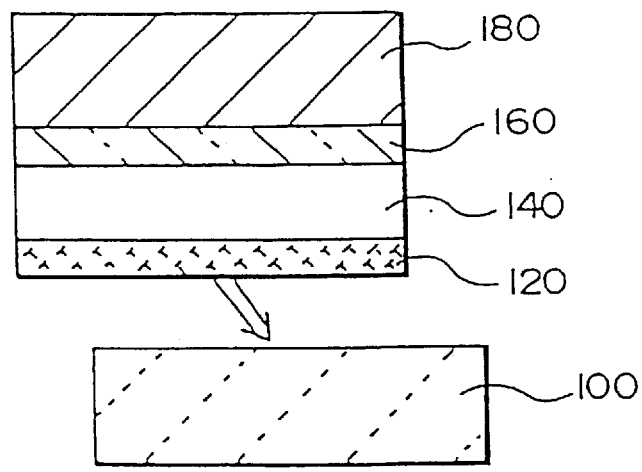

Next, as shown in FIG. 21, the substrate 100 is detached from the separation layer 120 by applying a force to the substrate 100. A part of the separation layer may remain on the substrate after the detachment, not shown in FIG. 21.

Figure 22:
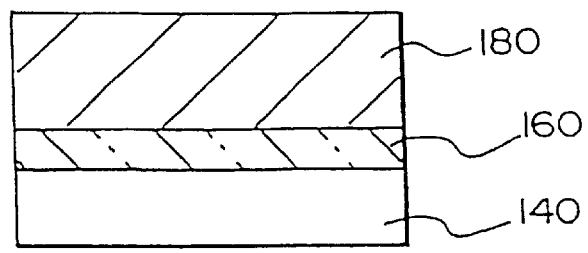

As shown in FIG. 22, the residual separation layer 120 is removed by etching, ashing, washing, polishing or a combination thereof. The transferred layer (thin film device layer) 140 is thereby transferred onto the transfer member 180. Also, the moiety of the separation layer remaining on the substrate 100 is removed. When the substrate 100 is composed of an expensive or rare material such as quartz glass, it is preferably reused (recycled). That is, the present invention is applicable to the substrate 100 to be reused, and is useful.

The transfer of the transferred layer (thin film device layer) 140 onto the transfer member 180 is completed by these steps. The $SiO_2$ film adjoining the transferred layer (thin film device layer) 140 may be removed, or a conductive layer for wiring and/or a protective film may be formed on the transferred layer 140.

In the present invention, the transferred layer (thin film device layer) 140 is not directly separated as the detached member, but the separation layer adhered to the transferred layer (thin film device layer) 140 is exfoliated, hence uniform exfoliation or transfer is easily, securely, and uniformly achieved regardless of characteristics and conditions of the detached member (transferred layer 140). Since the detached member (transferred layer 140) is not damaged during the exfoliating operation, it can maintain high reliability.

Examples 1 to 19 in the first embodiment can also be applied to the third embodiment.

Fourth Embodiment

The fourth embodiment includes a modification of a step in the third embodiment.

[Formation of an Amorphous Silicon Layer in the Step 1

When the separation layer 120 is composed of amorphous silicon (a-Si), it is preferably formed by a chemical vapor deposition (CVD) process, and particularly by a low pressure (LP) CVD process, compared with plasma CVD, atmospheric pressure (AP) CVD, and ECR processes. For example, an amorphous silicon layer formed by the plasma CVD process contains a relatively large quantity of hydrogen. The presence of hydrogen makes the ablation of the amorphous silicon layer easy, wherein hydrogen is released from the amorphous silicon layer at a temperature of higher than 350° C. The evolution of hydrogen during the step forming the thin film device may cause exfoliation of the film. Further, the plasma CVD film has relatively low adhesiveness, hence the substrate 100 may be detached from the transferred layer 140 in the wet washing step in the production of the device. In contrast, the LPCVD film has no possibility of evolution of hydrogen and has sufficient adhesiveness.

Figure 39:
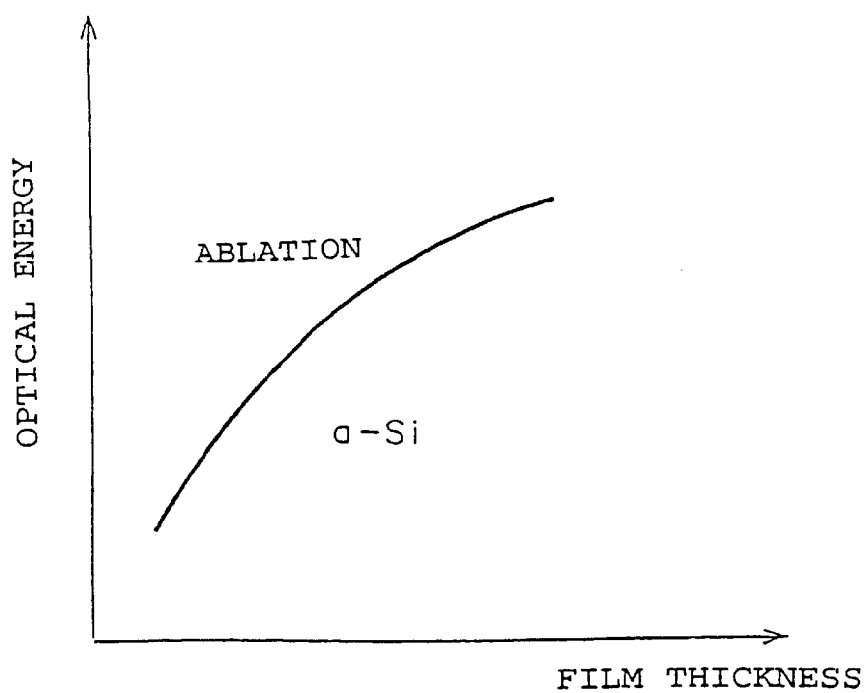
FIG. 39 is a graph of a relationship between optical energy absorbed in the separation layer and the thickness of the separation layer, for illustrating ablation in the separation layer which is composed of amorphous silicon.

The thickness of the amorphous silicon layer 120 as the separation layer will be described with reference to FIG. 39. In FIG. 39, the horizontal axis represents the thickness of the amorphous silicon layer, and the vertical axis represents the optical energy absorbed in this layer. As described above, when the amorphous silicon layer is irradiated with light, ablation occurs.

The word "ablation" means that solid components (the constituents of the separation layer 120), which absorbed the incident light, are photochemically and thermally excited and atoms and molecules in the solid components are released by the chain scission. The ablation is observed as phase transition such as melting or vaporization in the partial or entire constituents of the separation layer 120. Also, fine foaming may be formed by the phase change, resulting in a decreased adhering force.

The absorbed energy required for the ablation decreases with a decreased thickness, as shown in FIG. 39.

Accordingly, the thickness of the amorphous silicon layer 120 as the separation layer is reduced in this embodiment. The energy of the light incident on the amorphous silicon layer 120 is thereby reduced, resulting in lower energy consumption and miniaturization of the light source unit.

The thickness level of the amorphous silicon layer 120 as the separation layer will now be investigated. As shown in FIG. 39, the absorbed energy required for the ablation decreases as the thickness of amorphous silicon decreases. According to the present inventors investigation, it is preferable that the thickness be 25 nm or less, hence ablation can occur by the power of a general light source unit. Although the lower limit of the thickness is not limited, a lower limit of 5 nm may be determined in view of the secure formation and adhesiveness of the amorphous silicon layer. Accordingly, the preferable thickness of the amorphous silicon layer 120 ranges from 5 nm to 25 nm, and more preferably 15 nm or less for achieving further energy saving and higher adhesiveness. The optimum range of the thickness is 11 nm or less, and the absorbed energy required for the ablation can be significantly decreased near the thickness.

Fifth Embodiment

The fifth embodiment includes a modification of a step in the third or fourth embodiment.

[Reinforcement of the Transfer Member in the Step 3

Although the transfer member 180 has preferably a certain amount of rigidity as a mechanical property, it may have flexibility or elasticity. Such a mechanical property of the transfer member 180 is determined in consideration of the following point. When the separation layer 120 is irradiated with light, the constituent material of the separation layer 120 is photochemically or thermally excited, and molecules or atoms on and in the layer are cleaved to release molecules or atoms outside. It is preferable that the transfer member 180 has mechanical strength which is resistant to the stress acting on the upper portion of the separation layer 120 accompanied by the release of molecules or atoms. A deformation or breakage at the upper portion of the separation layer 120 can be thereby prevented.

Such mechanical strength may be imparted not only to the transfer member 180, but also to at least one layer lying above the separation layer 120, that is, the transferred layer 140, the adhesive layer 160, and the transfer member 180. The materials for and thicknesses of the transferred layer 140, adhesive layer 160, and transfer member 180 can be determined in order to achieve such mechanical strength.

When a combination of the transferred layer 140, adhesive layer 160 and transfer member 180 does not have sufficient mechanical strength, a reinforcing layer 132 may be formed at an appropriate position above the separation layer 120, as shown in FIGS. 42(A) to 42(E).

Figure 42:
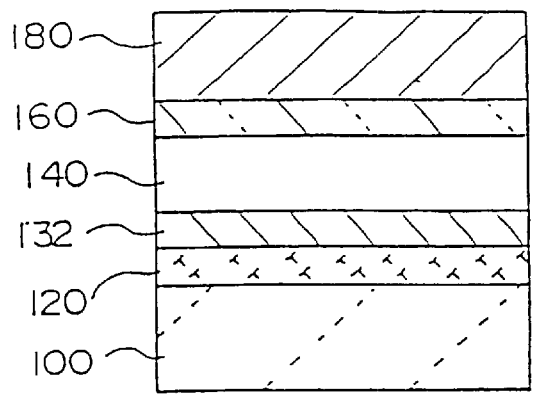
FIGS. 42(A) to 42(E) are cross-sectional views of another embodiment in which a reinforcing layer is provided to prevent deformation or breakage of a thin film device during exfoliation of a separation layer.
Figure 42:
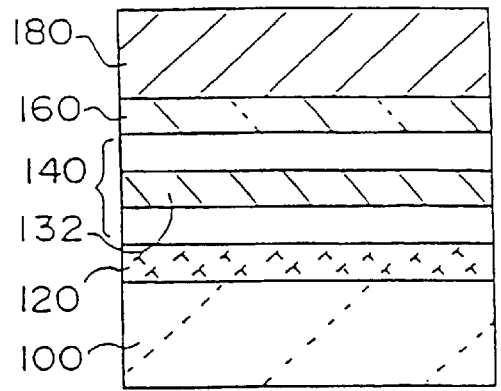
Figure 42:
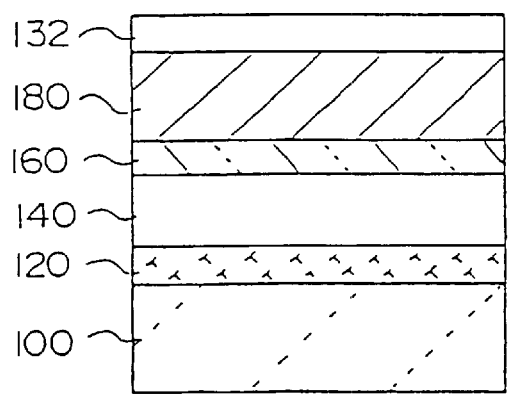
Figure 42:
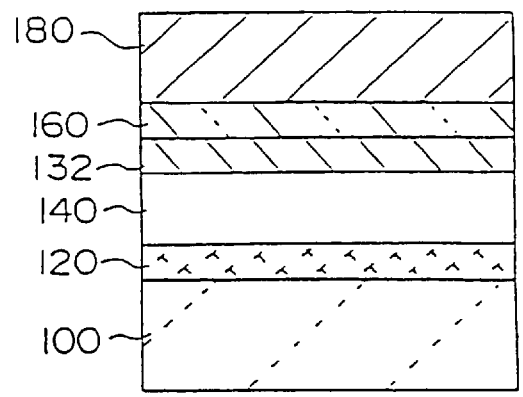
Figure 42:
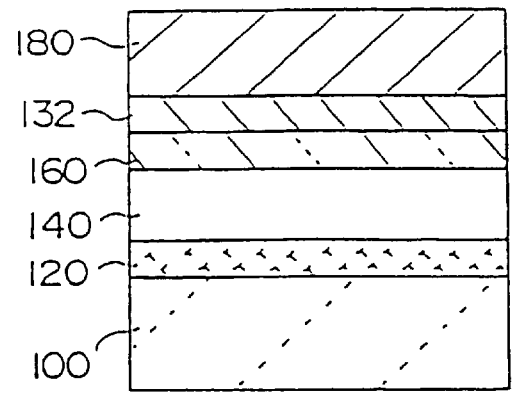

The reinforcing layer 132 shown in FIG. 42(A) is provided between the separation layer 120 and the transferred layer 140. After forming exfoliation in the separation layer 120 and detaching the substrate 100, the reinforcing layer 132 can be removed together with the remaining separation layer 120 from the transferred layer 140. As shown in FIG. 42(B), the reinforcing layer 132 provided above the transferred layer 180 can also be removed from the transferred layer 180, after the separation layer 120 is cleaved. The reinforcing layer 132 shown in FIG. 42(C) intervenes as, for example, an insulating layer in the transferred layer 140 composed of a plurality of layers. Each reinforcing layer 132 shown in FIGS. 42(D) and 42(E) is placed under or on the adhesive layer 160. In such a case, it cannot be removed later.

Sixth Embodiment

The sixth embodiment includes a modification of a step in any one of the third, fourth, and fifth embodiments.

[Formation of an Amorphous Silicon-Based Optical Absorption Layer as the Separation Layer in the Step 4

Figure 38:
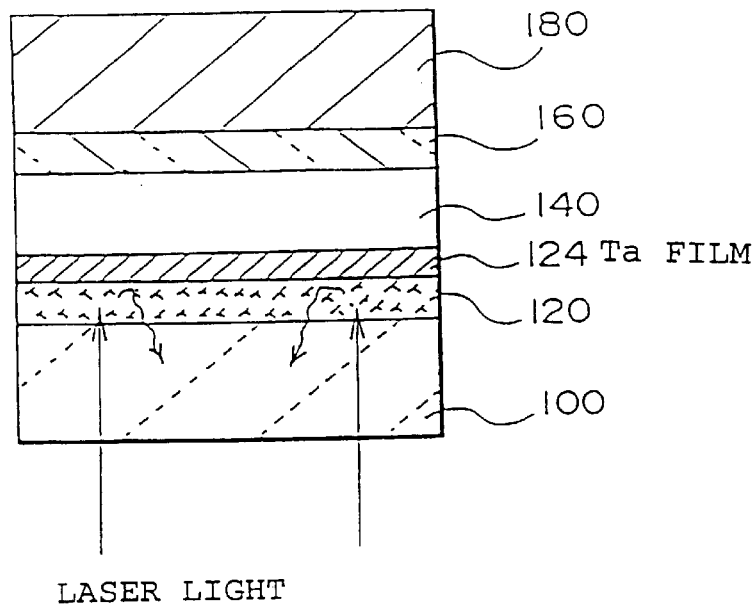
FIG. 38 is a cross-sectional view of another embodiment of a method for transferring a thin film device in accordance with the present invention.
Figure 40:
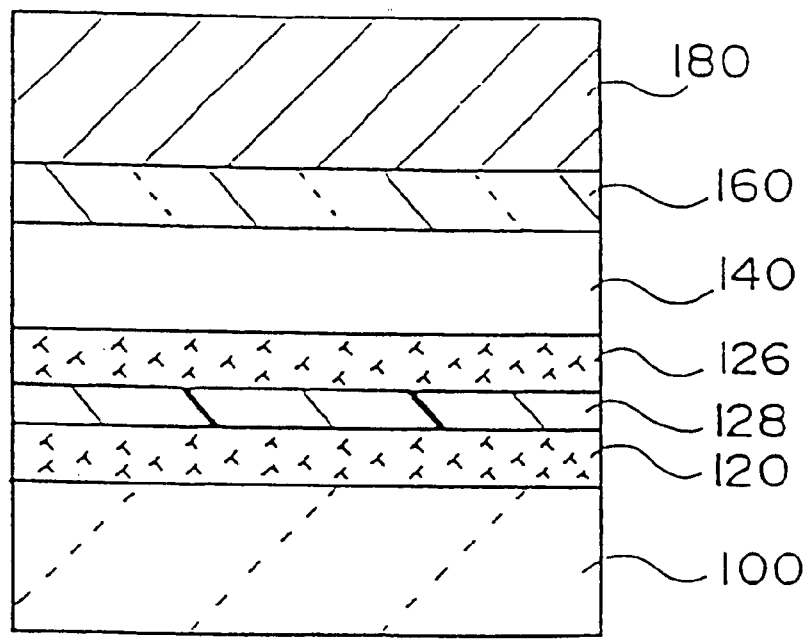
FIG. 40 is a cross-sectional view of another embodiment in which an amorphous silicon layer as an optical absorption layer is formed on an amorphous silicon layer as a separation layer with a silicon-based intervening layer therebetween.
Figure 41:
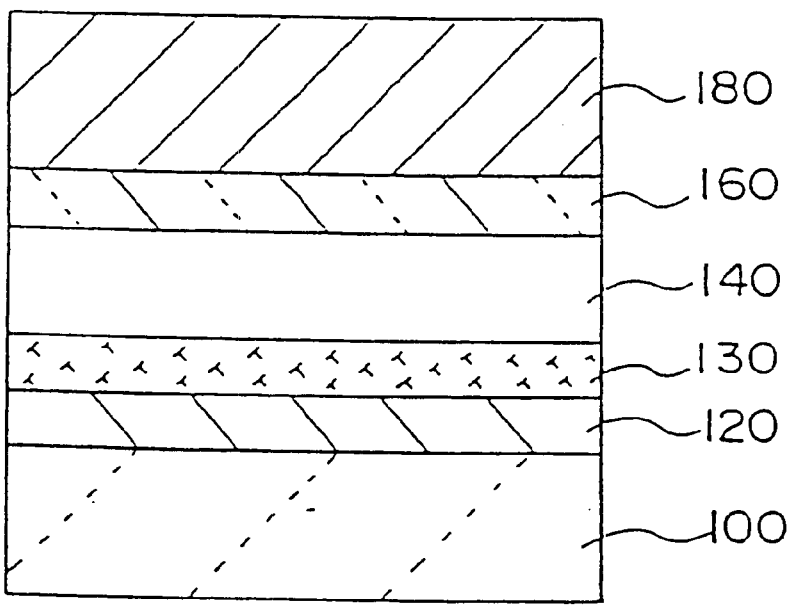
FIG. 41 is a cross-sectional view of another embodiment in which a silicon-based optical absorption layer composed of a material which is different from that of a separation layer is formed on the separation layer.

It is preferable that a method shown in FIG. 40 or 41 be employed instead of the method shown in FIG. 38. In FIG. 40, an amorphous silicon layer 120 is employed as the separation layer, and another amorphous silicon layer 126 is also employed as a silicon-based optical absorption layer. In order to separate these two amorphous silicon layers 120 and 126, a silicon oxide ($SiO_2$) film intervenes as a silicon-based intervening layer. Even if the incident light passes through the amorphous silicon layer 120 as the separation layer, the transmitted light is absorbed in the amorphous silicon layer 126 as the silicon-based optical absorption layer. As a result, the thin film device provided thereon is not adversely affected. Since the two additional layers 126 and 128 are composed of silicon, metallic contamination etc. does not occur in an established conventional film deposition technology.

When the thickness of the amorphous silicon layer 120 as the separation layer is larger than the thickness of the amorphous silicon layer 126 as the optical absorption layer, exfoliation in the amorphous silicon layer 126 can be securely prevented. Regardless of such a relationship of the thicknesses, however, the optical energy incident on the amorphous silicon layer 126 is considerably lower than the optical energy incident on the amorphous silicon layer 120 as the separation layer, no ablation occurs in the amorphous silicon layer 126.

FIG. 41 shows a case providing a silicon-based optical absorption layer 130 composed of a different material from that of the separation layer 120, wherein the silicon-based intervening layer is not always necessary.

When a countermeasure to optical leakage in the separation layer 120 is employed as shown in FIG. 40 or 41, adverse effects to the thin film device can be securely prevented even if the optical absorption energy for exfoliating the separation layer 120 is high.

Seventh Embodiment

The seventh embodiment includes a modification of a step in any one of the third to sixth embodiments.
[Modification of Irradiation with Light in the Step 4

A method of irradiation with light, which is suitable for a case not having a metallic film 124 shown in FIG. 38 and does not affect the thin film device, will now be described with reference to the drawings from FIG. 43 onwards.

Figure 43:
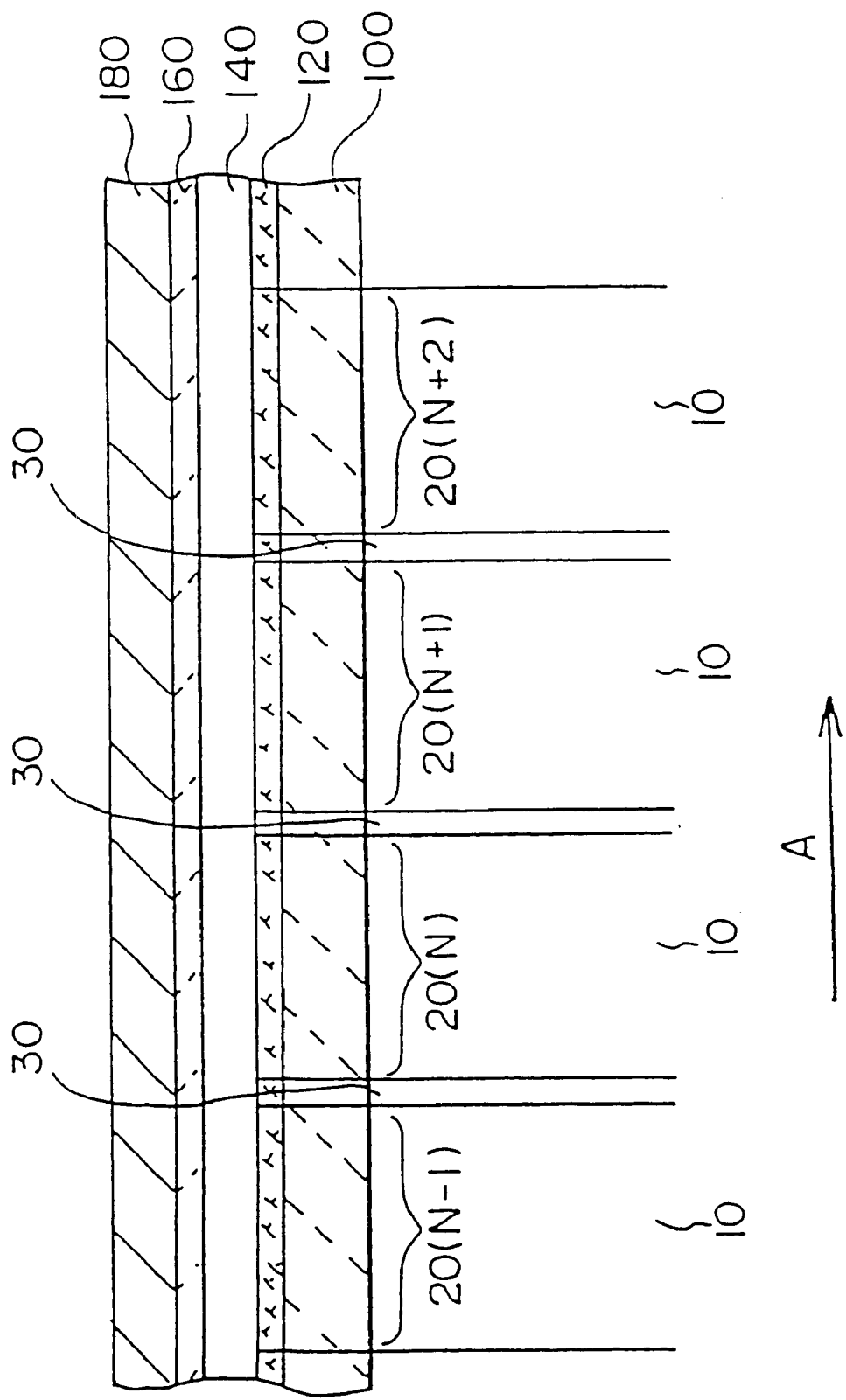
FIG. 43 is a schematic view illustrating a scanning operation of beams onto a separation layer in a step in a method for transferring a thin film device in accordance with the present invention.
Figure 44:
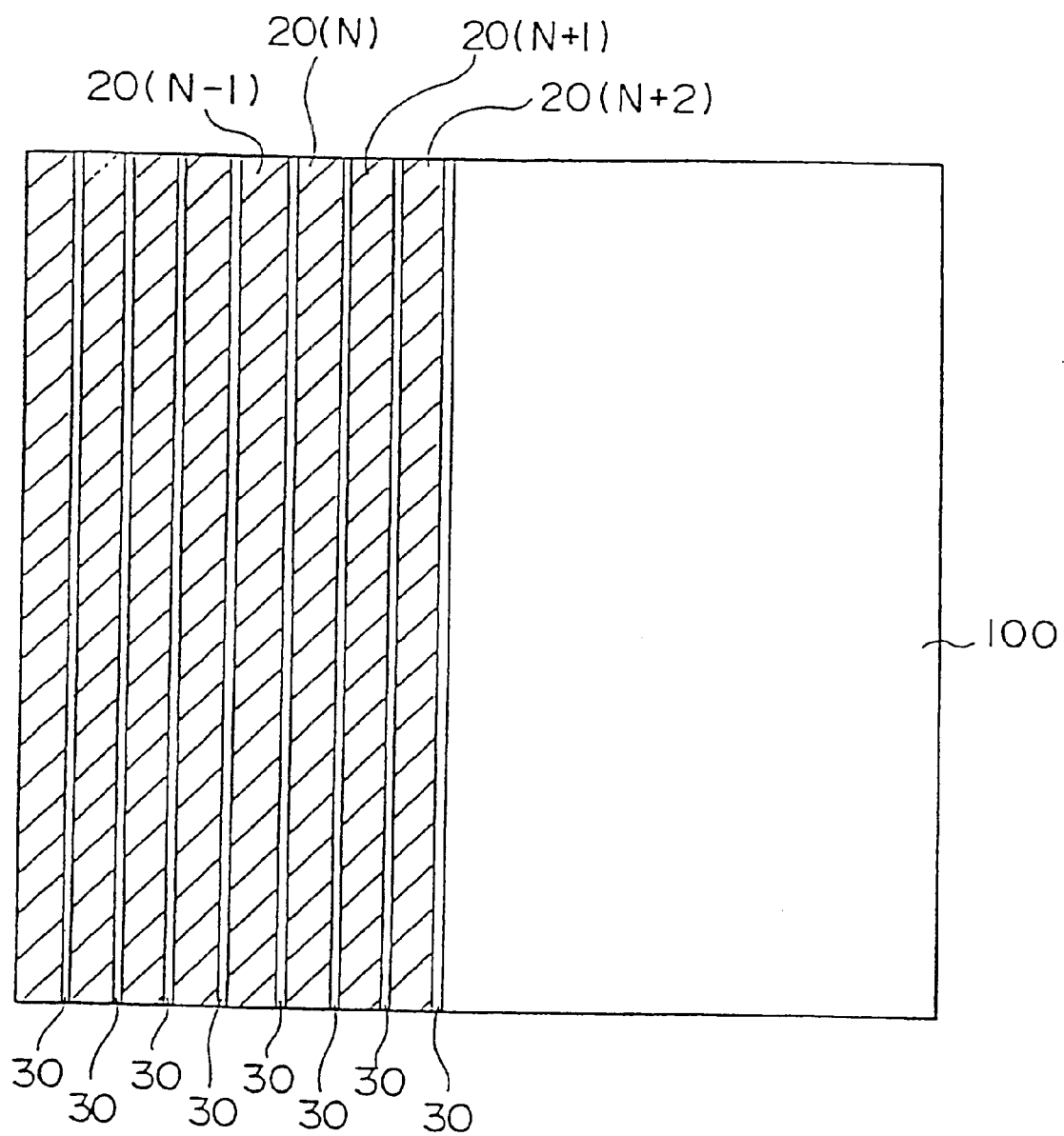
FIG. 44 is a plan view illustrating beam scanning in FIG. 42.
Figure 45:
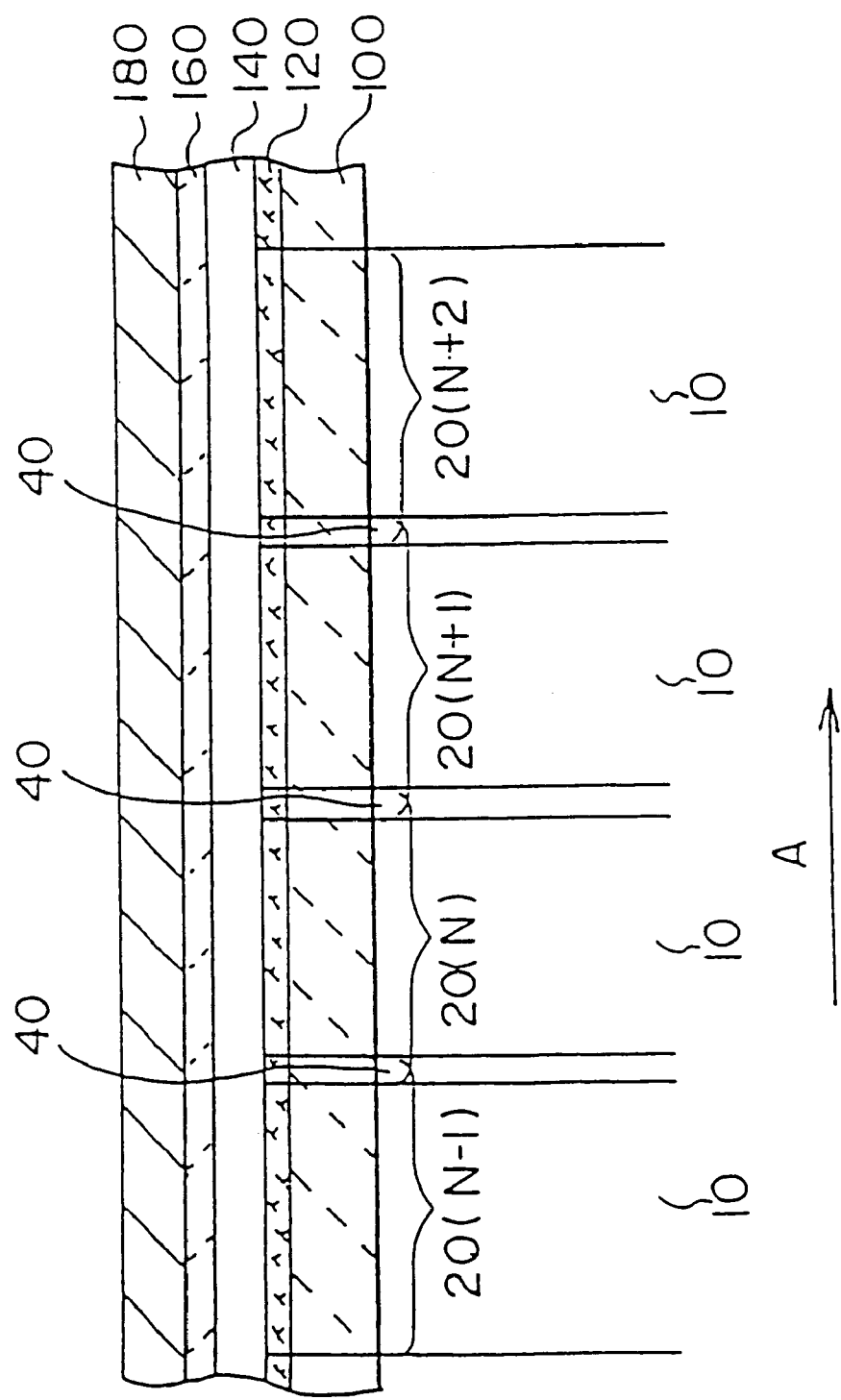
FIG. 45 is a schematic view illustrating another embodiment of a scanning-operation of beams onto a separation layer in a step in a method for transferring a thin film device in accordance with the present invention.

FIGS. 43 and 44 show a method for irradiating almost the entire separation layer 120 with light. In each drawing, the number of scanning times of line beams is represented by N, and beam scanning is performed such that the region 20(N) irradiated with the N-th line beam 10 does not overlap with the region 20(N+1) irradiated with the (N+1)-th line beam 10. As a result, a low- or non-irradiation region 30 which is significantly narrower than each irradiated region is formed between the two adjacent regions 20(N) and 20(N+1).

When the line beam 10 is moved to the direction shown by the arrow A in relation to the substrate 100 while radiating the beam, a low-irradiation region 30 is formed. Alternatively, when the beam is not radiated during such a movement, a non-irradiation region 30 is formed.

If the regions irradiated by different line beams overlap with each other, the separation layer 120 is irradiated with an excessive amount of incident light which is larger than that required for internal and/or interfacial exfoliation. When the light leaked from the separation layer 120 is incident on the transferred layer 140 including a thin film device, electrical and other characteristics of the thin film device will deteriorate.

In the method shown in FIGS. 43 and 44, the separation layer 120 is not irradiated with such excessive light, hence the original characteristics inherent to the thin film device can be maintained after the it is transferred onto the transfer member. Although exfoliating does not occur in the low- or non-irradiation region 30 in the separation layer 120, the adhesiveness between the separation layer 120 and the substrate 100 can be satisfactorily reduced by exfoliating in the regions irradiated with the line beams.

An example of beam scanning in view of the intensity of the line beam 10 will be described with reference to FIGS. 44 to 47.

In FIG. 44, beam scanning is performed such that the region 20(N) irradiated with the N-th line beam 10 overlaps with the region 20(N+1) irradiated with the (N+1)-th line beam 10. A doubly-irradiated region 40 is therefore formed between the two adjacent regions 20(N) and 20(N+1).

The following description is an explanation of why leakage caused by excessive incident light does not occur in the doubly-irradiated region 40 in the separation layer 120 and why the original characteristics of the thin film device can be maintained.

Figure 46:
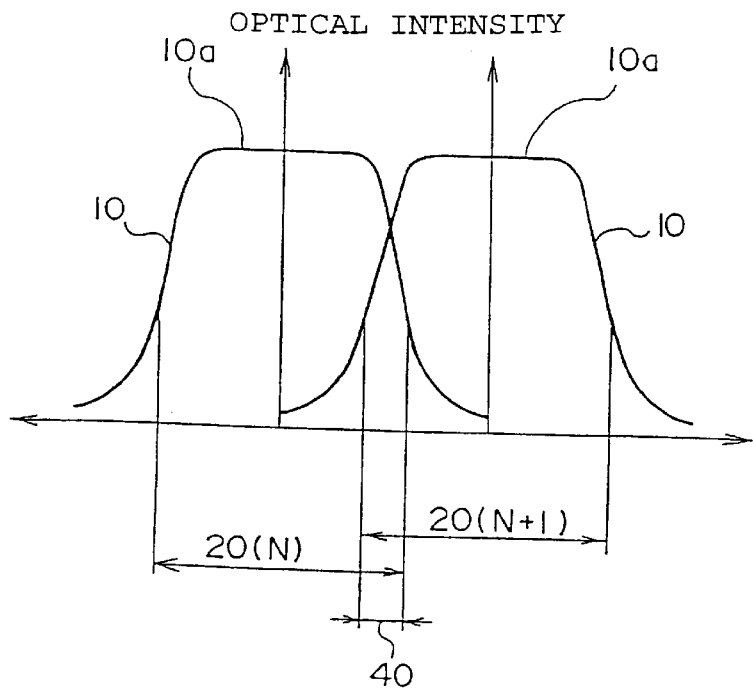
FIG. 46 is a graph of characteristic curves illustrating an intensity distribution of beams used in the beam scanning shown in FIG. 45.
Figure 47:
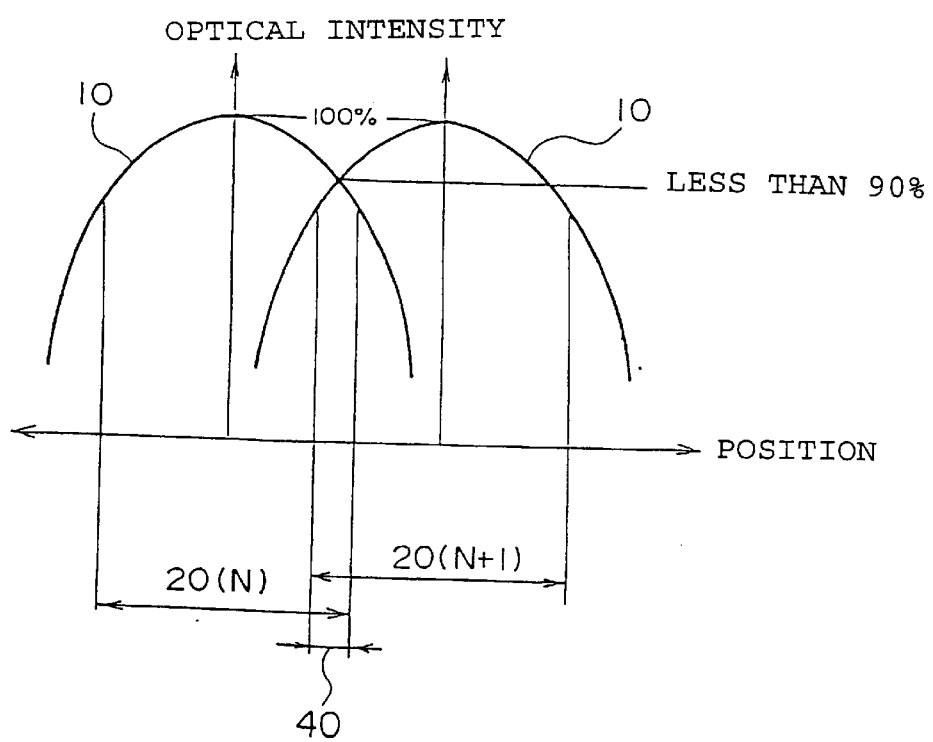
FIG. 47 is a graph of characteristic curves illustrating another intensity distribution of beams used in the beam scanning shown in FIG. 45.

FIGS. 46 and 47 are graphs of distributions of optical intensity vs. the position of the two adjacent line beams 10 and 10 in beam scanning.

In accordance with the distribution of the optical intensity shown in FIG. 46, each line beam 10 has a flat peak 10a having a maximum intensity at a predetermined region including the beam center. The two adjacent line beams 10 and 10 are scanned such that the two corresponding flat peaks 10a do not overlap with each other.

In contrast, according to the distribution of the optical intensity shown in FIG. 47, each line beam 10 has a beam center with a maximum intensity, wherein the optical intensity decreases at a point distant from the beam center. The two adjacent line beams 10 and 10 are scanned such that the two beam-effective regions having an intensity which is 90% of the maximum intensity of each line beam 10 do not overlap with each other.

As a result, the total dose (summation of products of optical intensities by irradiated times at each position) of the light beams incident on the doubly-irradiated region 40 is lower than that of the flat region or beam-effective region. The doubly-irradiated region 40, therefore, will first be cleaved at the second irradiation of the beams, and this does not correspond to the excessive irradiation of beam. If the relevant region of the separation layer is cleaved at the first irradiation, the intensity in the second irradiation of the light beam, which is incident on the thin film device, is reduced, hence deterioration of the electrical characteristics of the thin film device can be prevented or significantly reduced to a practical level.

In order to suppress leakage of light in the doubly-irradiated region 40, it is preferable that the intensity of each beam which is incident on the doubly-irradiated region 40 be less than 90%, more preferably 80% or less, and most preferably 50% or less of the maximum intensity at the center of each beam. When the intensity of the beam is significantly high so that exfoliation occurs at an intensity which is half (50%) the maximum intensity of the beam, overlapping at regions in which the intensity is higher than half of the maximum intensity may be avoided.

Such irradiation modes can also be applicable to beam shapes, such as a spot beam, other than a line beam. In the spot beam scanning, vertical and horizontal relationships between the adjacent irradiated regions must be taken into account.

The direction of the incident light including laser light is not limited to the direction perpendicular to the separation layer 120, and may be shifted by a given angle from the perpendicular direction as long as the intensity of the incident light is substantially uniform in the separation layer 120.

An example in accordance with the present invention will now be described. The example corresponds to a modification of the laser irradiation in Example 1 of the third embodiment.

MODIFIED EXAMPLES1

A quartz substrate with a length of 50 mm, a width of 50 mm, and a thickness of 1.1 mm (softening point: 1,630° C., distortion point: 1,070° C., and transmittance of excimer laser: approximately 100%) was prepared, and an amorphous silicon (a-Si) film as a separation layer (laser-absorption layer) was formed on the one side of the quartz substrate by a low pressure CVD process ($Si_2H_6$ gas, 425° C.). The thickness of the separation layer was 100 nm.

A $SiO_2$ film as an interlayer was formed on the separation layer by an ECR-CVD process ($SiH_4+O_2$ gas, 100° C.). The thickness of the interlayer was 200 nm.

A polycrystalline silicon (or polycrystalline silicon) film with a thickness of 50 nm as a transferred layer was formed on the interlayer by a CVD process ($Si_2H_6$ gas). The polycrystalline silicon film was patterned to form source/drain/channel regions of a thin film transistor. After a $SiO_2$ gate insulating film was formed by thermal oxidation of the surface of the polycrystalline silicon film, a gate electrode (a structure in which a high melting point metal, such as Mo, was deposited on the polycrystalline silicon) was formed on the gate insulating film, and source and drain regions were formed by self alignment by means of ion implantation using the gate electrode as a mask. A thin film transistor was thereby formed.

A thin film transistor having similar characteristics can be formed by a low temperature process instead of such a high temperature process. For example, an amorphous silicon film with a thickness of 50 nm as a transferred layer was formed on a $SiO_2$ film as an interlayer on the separation layer by a low pressure CVD process ($Si_2H_6$ gas, 425° C.), and the amorphous silicon film was irradiated with laser beams (wavelength: 308 nm) to modify the amorphous silicon into a polycrystalline silicon film by crystallization. The polycrystalline silicon film was patterned to form source/drain/channel regions having a given pattern of a thin film transistor. After a $SiO_2$ gate insulating film was deposited on the polycrystalline silicon film by a low pressure CVD process, a gate electrode (a structure in which a high melting point metal, such as Mo, was deposited on the polycrystalline silicon) was formed on the gate insulating film, and source and drain regions were formed by self alignment by means of ion implantation using the gate electrode as a mask. A thin film transistor was thereby formed.

Next, electrodes and leads connected to the source and drain regions and leads connected to the gate electrode were formed, if necessary. These electrodes and leads are generally composed of aluminum, but not for the limitation. A metal (not melted by laser irradiation in the succeeding step) having a melting point higher than that of aluminum may be used if melting of aluminum is expected in the succeeding laser irradiation step.

A UV-curable adhesive (thickness: 100 $\mu$m) was applied onto the thin film transistor, a large, transparent glass substrate (soda glass, softening point: 740° C., distortion point: 511° C.) as a transfer member was adhered to the adhesive film, and the outer surface of the glass substrate was irradiated with ultraviolet rays to fix these layers by curing the adhesive.

The surface of the quartz substrate was irradiated with Xe—Cl excimer laser beams (wavelength: 308 nm) to cause exfoliation (internal and interfacial exfoliation) of the separation layer. The energy density of the Xe—Cl excimer laser was 250 mJ/$CM^2$, and the irradiation time was 20 nano seconds. The excimer laser irradiation methods include a spot-beam irradiation method and a line-beam irradiation method. In the spot-beam irradiation method, a given unit area (for example 8 mm by 8 mm) is irradiated with a spot beam, and the spot irradiation is repeated while scanning the spot beam such that irradiated regions do not overlap with each other (in the vertical and horizontal directions), as shown in FIG. 43. In the line-beam irradiation, a given unit area (for example 378 mm □~0.1 mm, or 378 mm □~0.3 mm (absorbing 90% or more of the incident energy)) is irradiated while scanning the line-beam such that irradiated regions do not overlap with each other, as shown in FIG. 43. Alternatively, irradiation may be performed such that the total intensity of the beams is reduced in the doubly-irradiated region.

Next, the quartz substrate was detached from the glass substrate (transfer member) at the separation layer, so that the thin film transistor and interlayer formed on the quartz substrate were transferred onto the glass substrate. The separation layer remaining on the interlayer on the glass substrate was removed by etching, washing, or a combination thereof. A similar process was applied to the quartz substrate for recycling it.

When the glass substrate as the transfer member is larger than the quartz substrate, the transfer from the quartz substrate to the glass substrate in accordance with this example can be repeated to form a number of thin film transistors on different positions on the quartz substrate. A larger number of thin film transistors can be formed on the glass substrate by repeated deposition cycles.

Eighth Embodiment

An exfoliating method in accordance with the eighth embodiment of the present invention will now be described in detail with reference to the attached drawings. In the eighth embodiment, the exfoliation member or transferred layer in any one of the first to seventh embodiments is composed of a CMOS-TFT.

FIGS. 24 to 34 are cross-sectional views of the steps in the exfoliating method in this embodiment.

Figure 24:
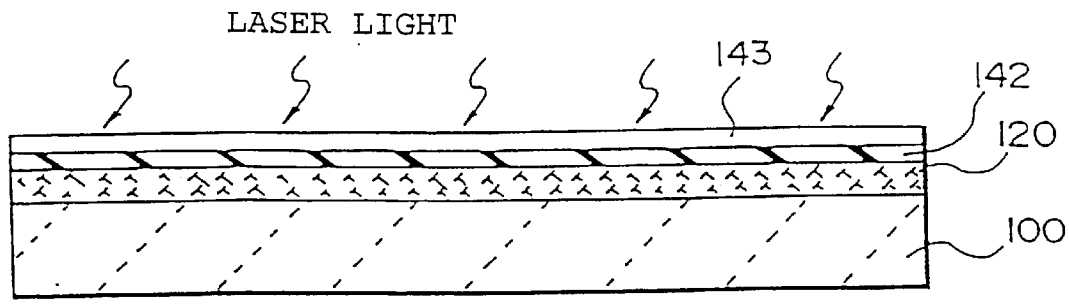
FIGS. 24 to 34 are cross-sectional views of steps in a fourth embodiment of a method for transferring a thin film device in accordance with the present invention.

[Step 1] As shown in FIG. 24, a separation layer (for example, an amorphous silicon layer formed by a LPCVD process) 120, an interlayer (for example, $SiO_2$ film) 142, and an amorphous silicon layer (for example, formed by a LPCVD process) 143 are deposited in that order on a substrate (for example, a quartz substrate) 100, and then the entire amorphous silicon layer 143 is irradiated with laser light beams to anneal the layer. The amorphous silicon layer 143 is thereby modified into a polycrystalline silicon layer by recrystallization.

Figure 25:
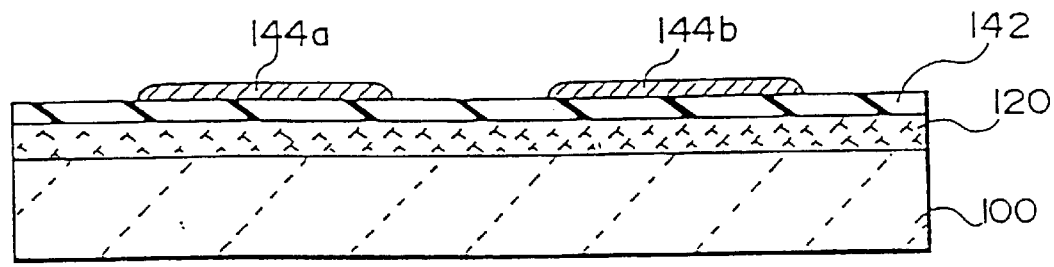

[Step 2] As shown in FIG. 25, the polycrystalline silicon layer formed by laser annealing is patterned to form islands 144a and 144b.

Figure 26:
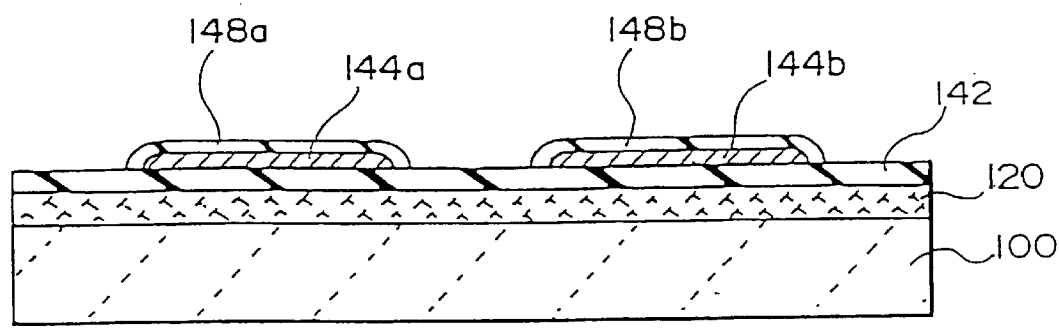

[Step 3] As shown in FIG. 26, gate insulating films 148a and 148b are formed to cover the islands 144a and 144b, for example, by a CVD process.

Figure 27:
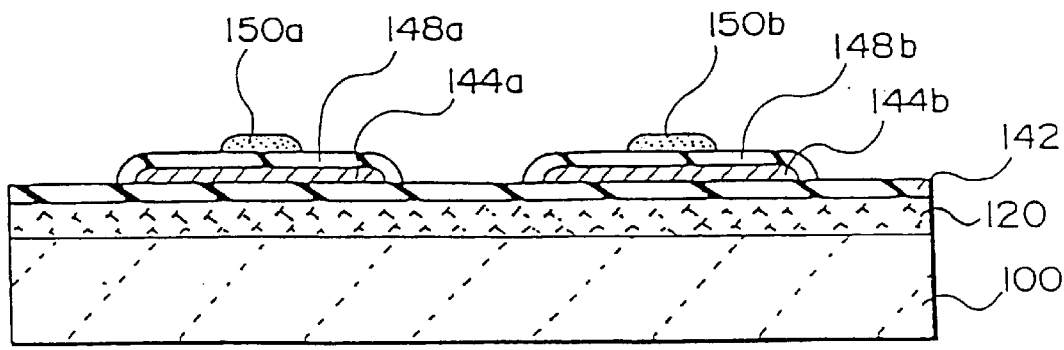

[Step 4] As shown in FIG. 27, gate electrodes 150a and 150b composed of polycrystalline silicon or metal are formed.

Figure 28:
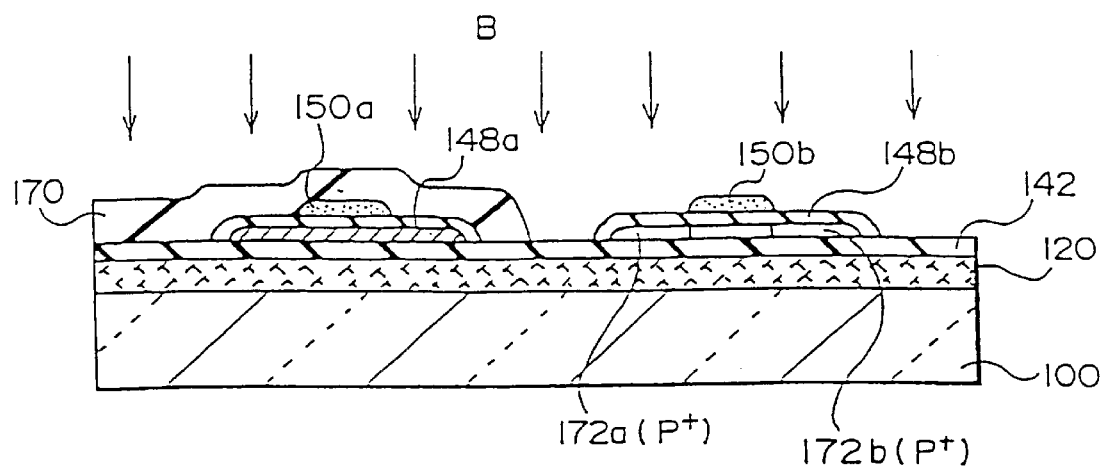

[Step 5] As shown in FIG. 28, a mask layer 170 composed of a polyimide resin etc. is formed, and for example, boron (B) is ion-implanted by self-alignment using the gate electrode 150b and the mask layer 170 as masks. p-Doped layers 172a and 172b are thereby formed.

Figure 29:
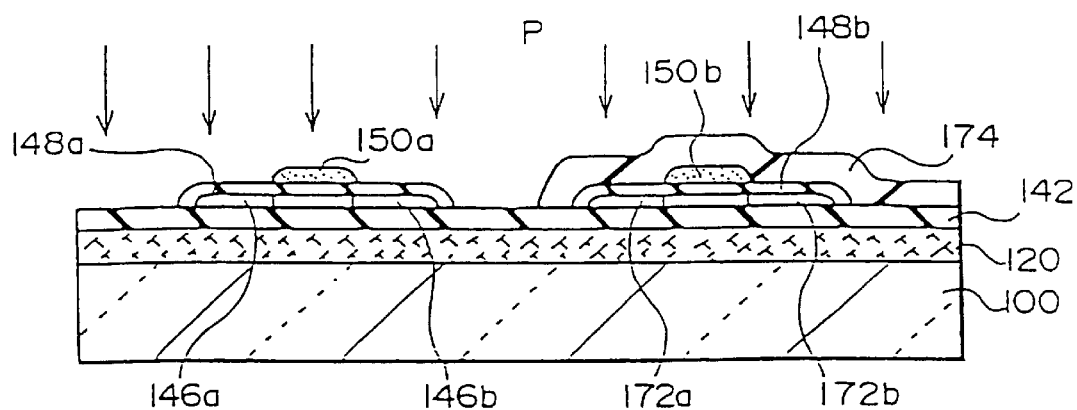

[Step 6] As shown in FIG. 29, a mask layer 174 composed of a polyimide resin etc. is formed, and for example, phosphorus (P) is ion-implanted by self-alignment using the gate electrode 150a and the mask layer 174 as masks. n-Doped layers 146a and 146b are thereby formed.

Figure 30:
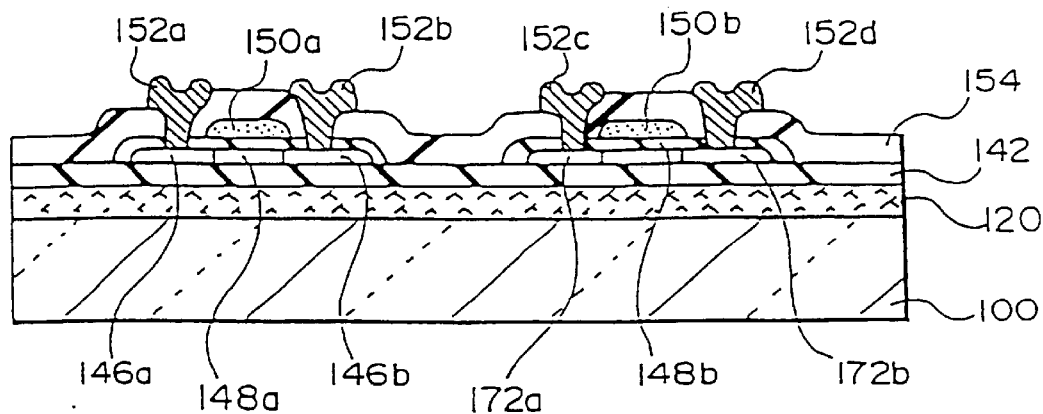

[Step 7] As shown in FIG. 30, an insulating interlayer 154 is formed, contact holes are selectively formed, and then electrodes 152a to 152d are formed.

The formed CMOS-TFT corresponds to the transferred layer (thin film device) shown in FIGS. 18 to 22. A protective film may be formed on the insulating interlayer 154.

Figure 31:
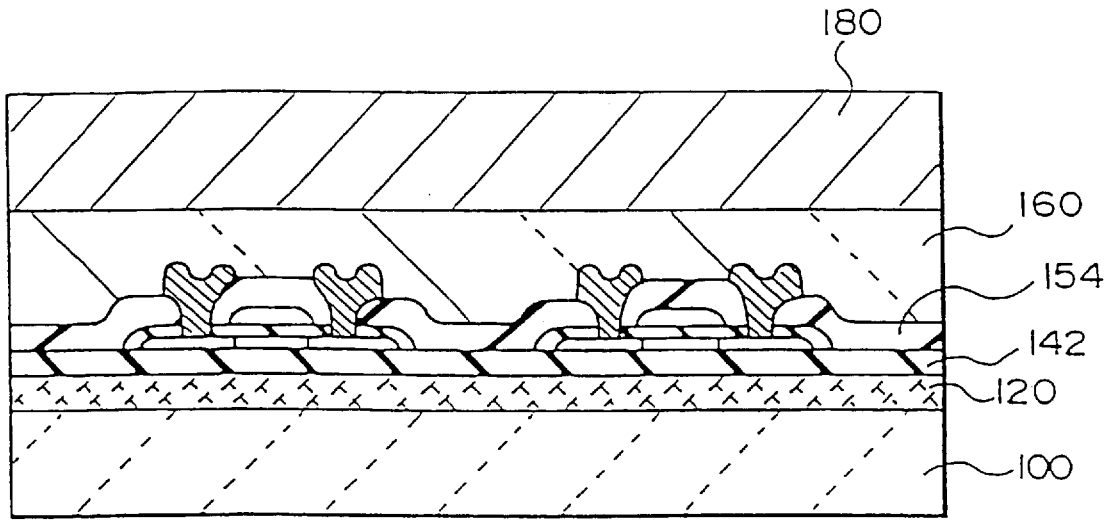

[Step 8] As shown in FIG. 31, an epoxy resin layer 160 as an adhesive layer is formed on the CMOS-TFT, and then the TFT is adhered to the transfer member (for example, a soda-glass substrate) 180 with the epoxy resin layer 160. The epoxy resin is cured by heat to fix the transfer member 180 and the TFT.

A photo-polymeric resin which is a UV-curable adhesive may also be used as the adhesive layer 160. In such a case, the transfer member 180 is irradiated with ultra-violet rays to cure the polymer.

Figure 32:
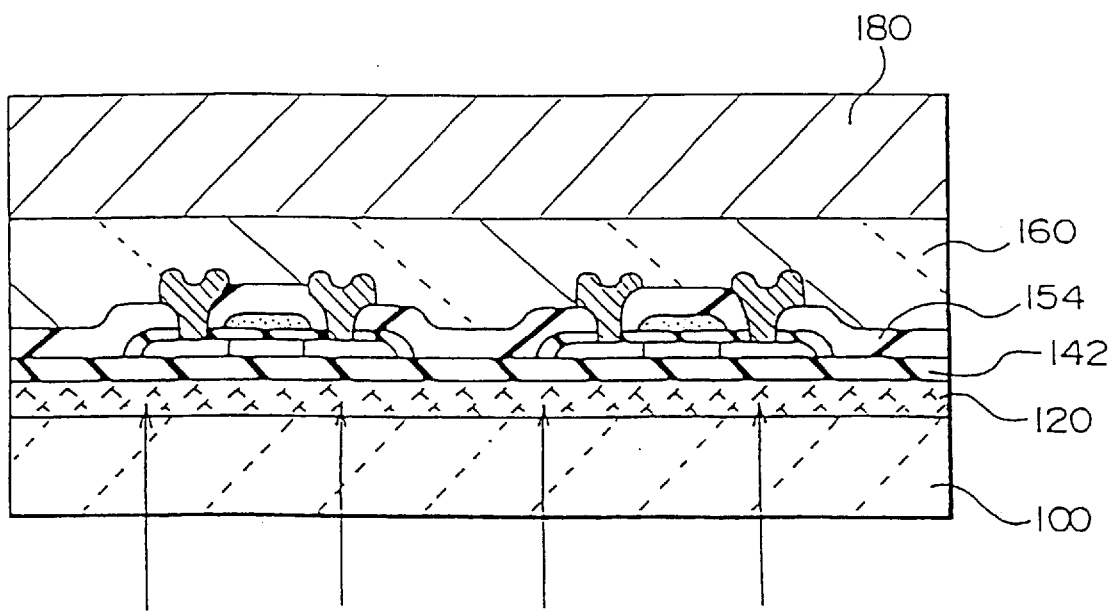

[Step 9] As shown in FIG. 32, the rear surface of the substrate 100 is irradiated with, for example, Xe—Cl excimer laser beams in order to cause internal and/or interfacial exfoliation of the separation layer 120.

Figure 33:
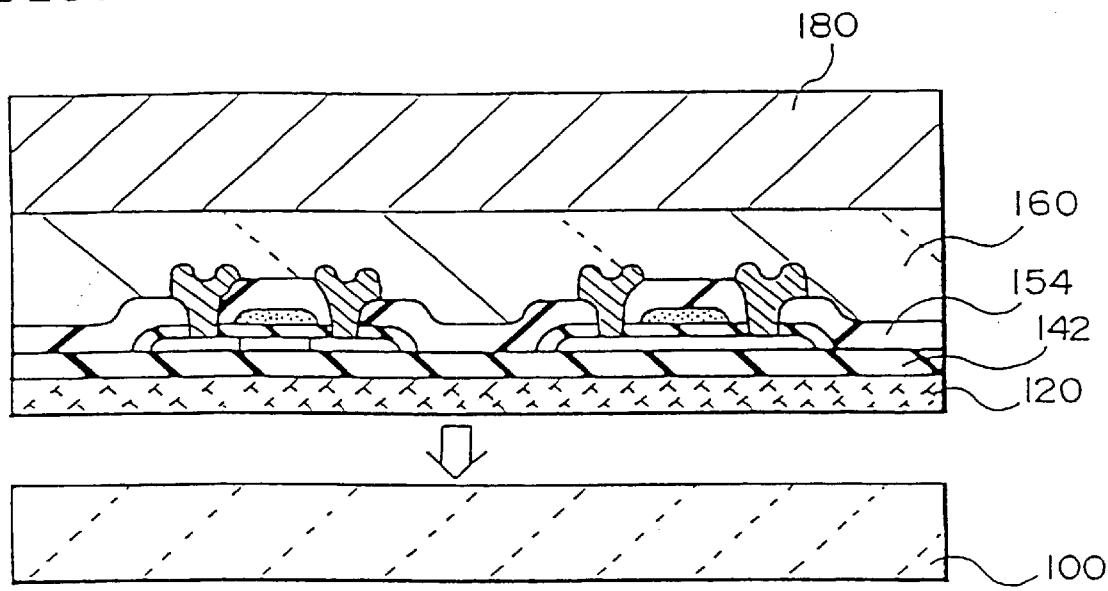

[Step 10] As shown in FIG. 33, the substrate 100 is detached.
[Step 11] The separation layer 120 is removed by etching.

Figure 34:
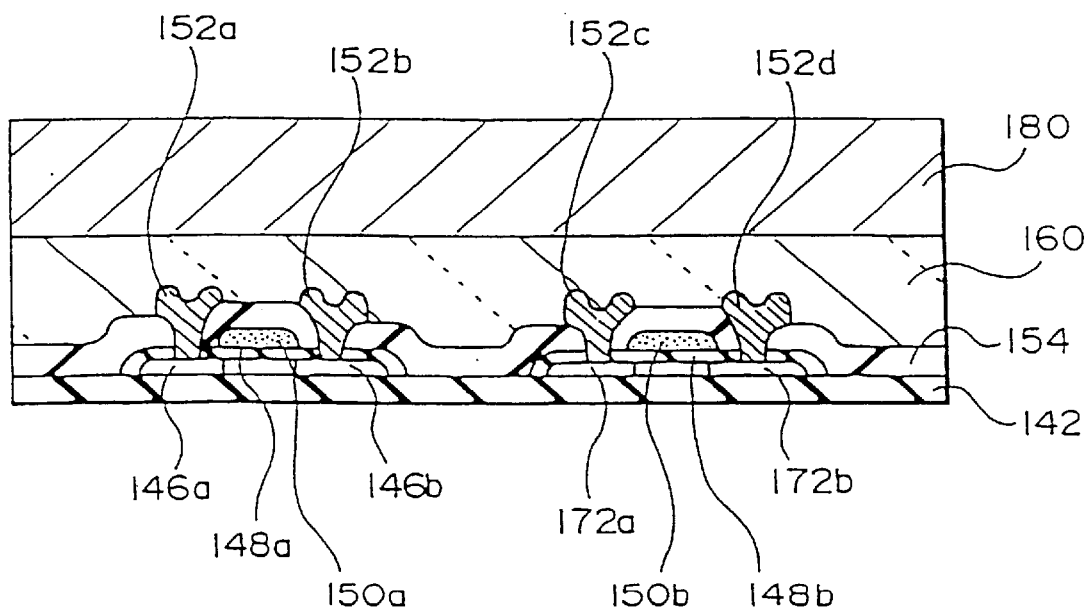

As shown in FIG. 34, thereby, the CMOS-TFT is transferred onto the transfer member 180.

Ninth Embodiment

Figure 35:
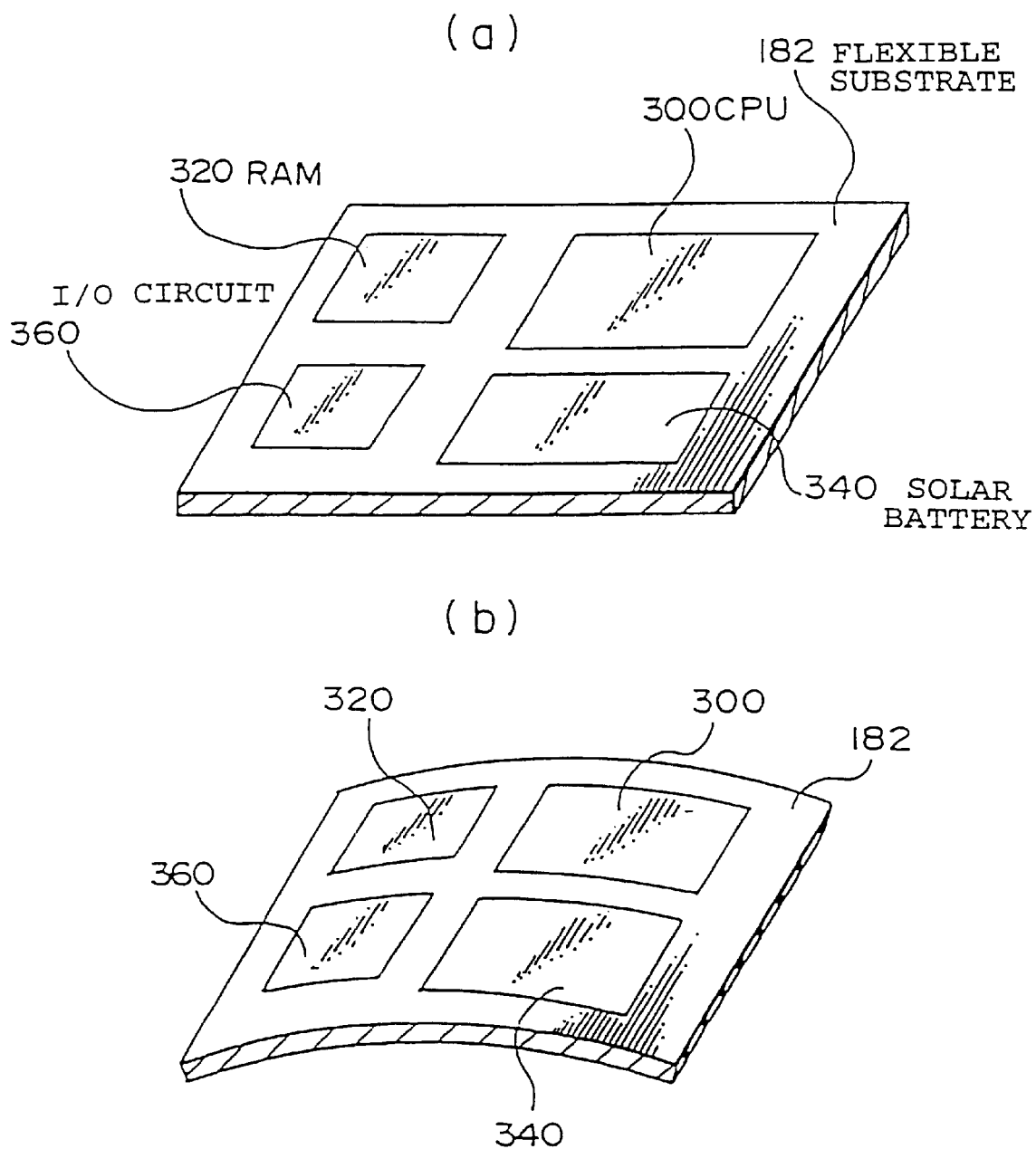
FIGS. 35(a) and 35(b) are isometric views of a microcomputer produced in accordance with the present invention.

The use of transfer technologies of thin film devices described in the first to eighth embodiments enables the formation of a microcomputer composed of thin film devices on a given substrate, for example, as shown in FIG. 35(a). In FIG. 35(a), on a flexible substrate 182 composed of plastic etc., a CPU 300 provided with a circuit including thin film devices, a RAM 320, an input-output circuit 360, and a solar battery 340 having PIN-junction of amorphous silicon for supplying electrical power to these circuits are mounted. Since the microcomputer in FIG. 35(a) is formed on the flexible substrate, it is resistive to bending, as shown in FIG. 35(b), and to dropping because of its light weight.

Tenth Embodiment

Figure 36:
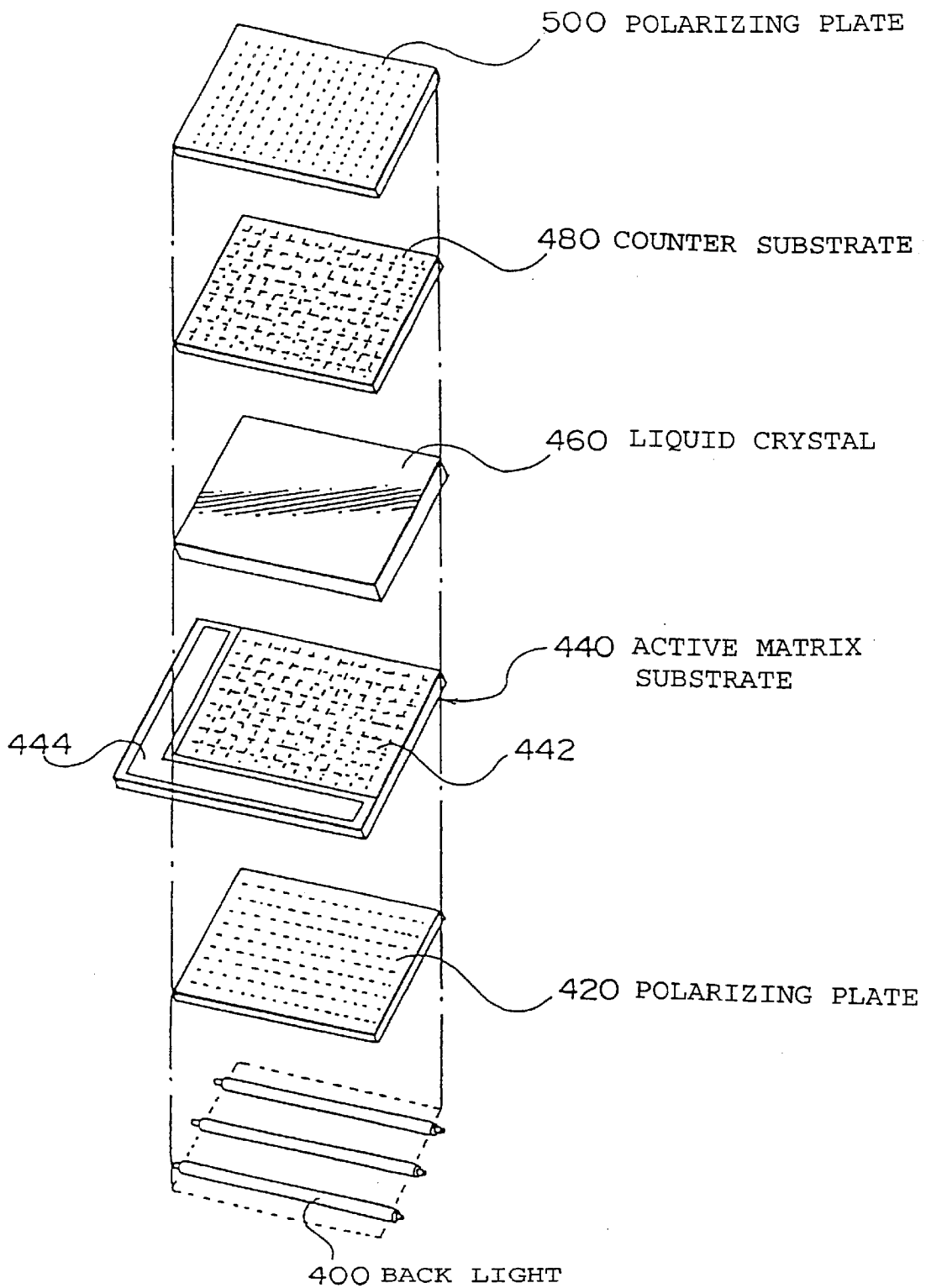
FIG. 36 is a schematic view illustrating a configuration of a liquid crystal display device.
Figure 37:
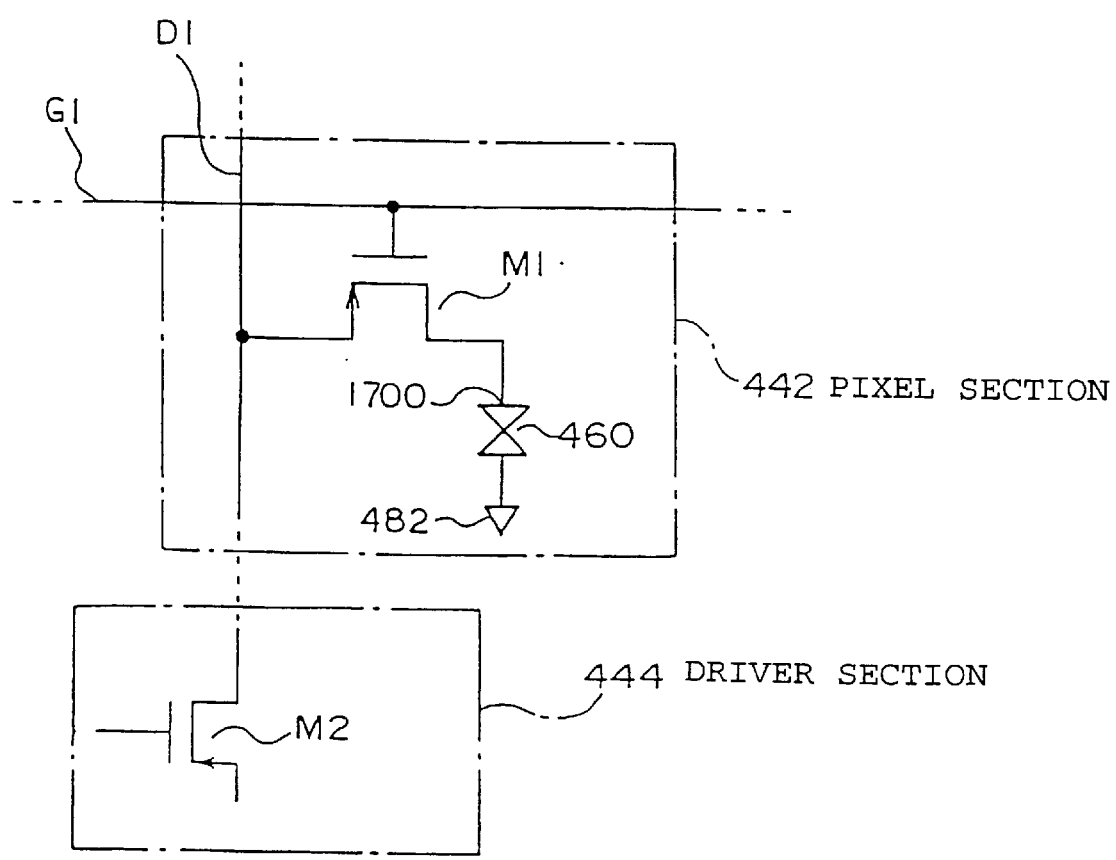
FIG. 37 is a schematic view illustrating a configuration of the main section in a liquid crystal display device.

An active matrix liquid crystal display device, shown in FIGS. 36 and 37, using an active matrix substrate can be produced by a transfer technology of any one of the first to fourth embodiments.

As shown in FIG. 36, the active matrix liquid crystal display device is provided with an illumination source 400 such as a back light, a polarizing plate 420, an active matrix substrate 440, a liquid crystal 460, a counter substrate 480, and a polarizing plate 500.

When a flexible active matrix substrate 440 and a counter substrate 480 such as plastic film are used, a flexible, lightweight active matrix liquid crystal panel resistant to impact can be achieved by substituting a reflecting liquid crystal panel using a reflective plate instead of the illumination source 400. When the pixel electrode is formed of metal, the reflecting plate and the polarizing plate 420 are not required.

The active matrix substrate 440 used in this embodiment is a driver-built-in active matrix substrate in which a TFT is provided in a pixel section 442 and a driver circuit (a scanning line driver and a data line driver) 444 is built in.

A circuit of a main section of the active matrix liquid crystal display device is shown in FIG. 37. As shown in FIG. 37, in a pixel section 442, a gate is connected to a gate line G1, and either a source or a drain is connected to a data line D1. Further, the pixel section 442 includes a TFT (M1) and a liquid crystal 460, wherein the other of the source and drain is connected to the liquid crystal 460. A driver section 444 includes a TFT (M2) formed by the same process as for the TFT (M1) in the pixel section 442.

The active matrix substrate 440 including TFTs (M1 and M2) can be formed by the transferring method in accordance with either the third or fourth embodiment.

Industrial Applicability

In accordance with the present invention as described above, various types of exfoliation members (detached members) capable of forming on substrates are transferred onto transfer members which are other than the substrates which are used in the formation of the exfoliation members so that the exfoliation members are arranged on the transfer members which are other than the substrates used in the formation of the exfoliation members. Accordingly, the present invention is applicable to production of various devices including liquid crystal devices and semiconductor integrated circuits.

What is claimed is:
1. A transferring method, comprising:
   forming a separation layer over the substrate;
   forming an interlayer over the separation layer;
   forming a transferred layer on the interlayer;
   joining a transfer member to the transferred layer; and
   causing exfoliation at at least one of the separation layer and an interface between the separation layer and the substrate, the transferred layer being transferred to the transfer member.
2. The transferring method according to claim 1, the interlayer comprising a material selected from the group consisting of a silicon oxide, a metal and alloy including at least one of Pt, Au, W, Ta, Mo, Al, Cr and Ti.
3. The transferring method according to claim 2, separation layer including an amorphous silicon, and the interlayer including a silicon oxide.
4. The transferring method according to claim 2, the transferred layer including PZT, and the interlayer including a metal.
5. The transferring method according to claim 4, the interlayer including a metal selected from the group consisting of Pt, Au, W, Ta, Mo, Al, Cr, Ti and an alloy thereof.
6. The transferring method according to claim 1, the interlayer being at least one of a protective layer chemically or physically protecting the transferred layer, an insulating layer, a conductive layer, shading layer, a barrier layer prohibiting migration of components to or from the transferred layer and a reflection layer.
7. The transferring method according to claim 1, the thickness of the interlayer being between 10 nm and 5 $\mu$m.
8. The transferring method according to claim 1, further comprising forming an adhesive layer over the transferred layer to join the transferred layer with the transfer member.
9. The transferring method according to claim 8, the adhesive layer comprising an adhesive selected from the group consisting of a curable adhesive, a reactive curing adhesive, a photo-setting adhesive, a heat-hardening adhesive, a UV-curing adhesive and an anaerobic adhesive.
10. The transferring method according to claim 8, the substrate having transparency, and being illuminated from the substrate side to harden the adhesive.
11. The transferring method according to claim 8, the transfer member having transparency, and being illuminated from the transfer member to harden the adhesive.
12. The transferring method according to claim 1, the transferred layer comprising at least one of a thin film semiconductor device including a thin film transistor and a thin film diode, an electrode, a photovoltaic device, an actuator, micro-magnetic device, an optical thin film, a superconducting thin film and a multi-layered thin film.
13. The transferring method according to claim 1, further comprising depositing a silicon layer on the interlayer to form a thin film transistor.
14. A method for manufacturing an active matrix substrate, comprising:
   forming a separation layer over the substrate;
   forming an interlayer over the separation layer;
   forming a transferred layer including a plurality of thin film transistors on the interlayer;
   joining a transfer member, which is supposed to be the active matrix substrate, to the a transferred layer; and
   causing exfoliation at at least one of the separation layer and an interface between the separation layer and the substrate, such that the thin film transistors are transferred to the transfer member.
15. The method for manufacturing an active matrix substrate according to claim 14, the active matrix substrate comprising a pixel portion and a driver portion, at least one of which having the transistor.

* * * * *

UNITED STATES PATENT AND TRADEMARK OFFICE
CERTIFICATE OF CORRECTION

PATENT NO. : 6,645,830 B2
DATED : November 11, 2003
INVENTOR(S) : Tatsuya Shimoda et al.

It is certified that error appears in the above-identified patent and that said Letters Patent is hereby corrected as shown below:

<u>Title page,</u>
Item [56], References Cited, FOREIGN PATENT DOCUMENTS, add:

-- JP 8-152512    6/1996
      JP 2-90624     3/1990 --

Signed and Sealed this

Sixth Day of April, 2004

JON W. DUDAS
*Acting Director of the United States Patent and Trademark Office*